US010147671B2

(12) United States Patent
Hayashi et al.

(10) Patent No.: US 10,147,671 B2
(45) Date of Patent: Dec. 4, 2018

(54) SEMICONDUCTOR DEVICE AND METHOD FOR MANUFACTURING SAME

(71) Applicant: DENSO CORPORATION, Kariya, Aichi-pref. (JP)

(72) Inventors: Eiji Hayashi, Kariya (JP); Wataru Kobayashi, Kariya (JP); Eiji Nomura, Kariya (JP); Kazuki Kouda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/508,506

(22) PCT Filed: Dec. 4, 2015

(86) PCT No.: PCT/JP2015/006035
§ 371 (c)(1),
(2) Date: Mar. 3, 2017

(87) PCT Pub. No.: WO2016/092791
PCT Pub. Date: Jun. 16, 2016

(65) Prior Publication Data
US 2017/0278774 A1    Sep. 28, 2017

(30) Foreign Application Priority Data

Dec. 10, 2014    (JP) ................................. 2014-250186
May 14, 2015    (JP) ................................. 2015-99403
Nov. 13, 2015    (JP) ................................. 2015-223330

(51) Int. Cl.
*H01L 23/48*    (2006.01)
*H01L 23/495*    (2006.01)
(Continued)

(52) U.S. Cl.
CPC ...... *H01L 23/4952* (2013.01); *H01L 21/4825* (2013.01); *H01L 21/565* (2013.01);
(Continued)

(58) Field of Classification Search
CPC ............... H01L 23/4952; H01L 23/293; H01L 23/3142; H01L 25/50; H01L 21/4825;
(Continued)

(56) References Cited

U.S. PATENT DOCUMENTS 6,703,707 B1    3/2004    Mamitsu et al.
2003/0132530 A1*    7/2003    Teshima ............... H01L 23/3135
257/780

(Continued)

FOREIGN PATENT DOCUMENTS

JP    07-007259 A    1/1995
JP    08-148647 A    6/1996
(Continued)

*Primary Examiner* — Thinh T Nguyen
(74) *Attorney, Agent, or Firm* — Posz Law Group, PLC

(57) ABSTRACT

A semiconductor device includes: a semiconductor chip having an electrode on one surface; a first conductive member disposed on one surface side of the semiconductor chip; a metal member having a base member and a membrane and disposed between the semiconductor chip and the first conductive member; a first solder disposed between the electrode of the semiconductor chip and the metal member; and a second solder disposed between the metal member and the first conductive member. The membrane has a metal thin film arranged on the surface of the base member and an uneven oxide film. The uneven oxide film is arranged on the metal thin film in at least a part of a connection region of a surface of the metal member, the connection region connecting a first connection region to which the first solder is connected and a second connection region to which the second solder is connected.

18 Claims, 14 Drawing Sheets

(51) Int. Cl.
*H01L 21/48* (2006.01)
*H01L 21/56* (2006.01)
*H01L 23/29* (2006.01)
*H01L 23/31* (2006.01)
*H01L 25/065* (2006.01)
*H01L 25/00* (2006.01)
*H01L 23/433* (2006.01)
*H01L 23/488* (2006.01)

(52) U.S. Cl.
CPC ........ *H01L 23/293* (2013.01); *H01L 23/3107* (2013.01); *H01L 23/3142* (2013.01); *H01L 23/4334* (2013.01); *H01L 23/488* (2013.01); *H01L 23/49527* (2013.01); *H01L 23/49562* (2013.01); *H01L 23/49575* (2013.01); *H01L 25/0655* (2013.01); *H01L 25/50* (2013.01); *H01L 2224/33* (2013.01); *H01L 2924/181* (2013.01)

(58) Field of Classification Search
CPC ............... H01L 51/565; H01L 25/0655; H01L 23/49527
USPC ........ 257/780, 781, 782, 786, 787, E23.092, 257/E21.382, E29.027; 438/614, 118, 438/112, 124
See application file for complete search history.

(56) References Cited

U.S. PATENT DOCUMENTS

| | | |
|---|---|---|
| 2003/0151140 A1 | 8/2003 | Nishiyama et al. |
| 2007/0057373 A1 | 3/2007 | Okumura et al. |
| 2013/0313711 A1* | 11/2013 | Kumagai ............ H01L 23/3735 257/772 |
| 2015/0294927 A1 | 10/2015 | Yamashita et al. |
| 2016/0207148 A1 | 7/2016 | Kobayashi et al. |

FOREIGN PATENT DOCUMENTS

| | | |
|---|---|---|
| JP | 2005-136332 A | 5/2005 |
| JP | 2006-352080 A | 12/2006 |
| JP | 2007-173537 A | 7/2007 |
| JP | 2008-247633 A | 10/2008 |
| JP | 2009-066851 A | 4/2009 |
| JP | 2012-243889 A | 12/2012 |
| JP | 2013-123011 A | 6/2013 |

\* cited by examiner

FIG. 9

|  |  | REFERENCE AMOUNT | REFERENCE AMOUNT × 3 |
|---|---|---|---|
| WITHOUT UNEVEN OXIDE FILM | | ○ | × |
| WITH UNEVEN OXIDE FILM | FULL SIDE SURFACE | ○ | ○ |
| | 1/2 SIDE SURFACE | ○ | ○ |
| | 1/3 SIDE SURFACE | ○ | ○ |

FIG. 10

| | | NUMBER OF BRIDGE FORMATIONS/ NUMBER OF TERMINALS | |
|---|---|---|---|
| TERMINAL SIDE SURFACE STATE | WITH/WITHOUT UNEVEN OXIDE FILM | MATERIAL TOLERANCE Typ | MATERIAL TOLERANCE max |
| WITHOUT METAL THIN FILM | WITHOUT FILM | 5/172 | 2/2 |
| ELECTRIC NI PLATING | WITHOUT FILM | 0/226 | 2/2 |
| | WITH FILM | 0/24 | 4/4 |
| ELECTROLESS NI PLATING | WITHOUT FILM | 0/4 | 6/6 |
| | WITH FILM | 0/4 | 0/12 |

FIG. 11

| ENERGY DENSITY / METAL THIN FILM | 2.0 | 4.0 | 6.0 | 8.0 | 10.0 | 12.0 | 14.0 | 16.0 |
|---|---|---|---|---|---|---|---|---|
| ELECTRIC NI PLATING | × | △ | △ | △ | △ | ○ | ○ | ○ |
| ELECTROLESS NI PLATING | × | ○ | ○ | ○ | ○ | ○ | ○ | ○ |

SEMICONDUCTOR DEVICE AND METHOD FOR MANUFACTURING SAME

CROSS REFERENCE TO RELATED APPLICATIONS

This application is a U.S. national stage application of International Patent Application No. PCT/JP2015/006035 filed on Dec. 4, 2015 and is based on Japanese Patent Application No. 2014-250186 filed on Dec. 10, 2014, No. 2015-99403 filed on May 14, 2015, and No. 2015-223330 filed on Nov. 13, 2015, the disclosures of which are incorporated herein by reference.

TECHNICAL FIELD

The present disclosure relates to a semiconductor device in which a first conductive member is disposed on one surface side of a semiconductor chip via a metal member and an electrode provided on one surface and the metal member are connected by first solder while the metal member and the first conductive member are connected by second solder, and to a manufacturing method of such a semiconductor device.

BACKGROUND

A semiconductor device disclosed in, for example, Patent Literature 1 which has a configuration in which a first conductive member (second metal plate) is disposed on one surface side of a semiconductor chip (semiconductor element) via a metal member (block body), and an electrode provided on one surface and the metal member are connected by first solder while the metal member and the first conductive member are connected by second solder is known.

The semiconductor device also includes a second conductive member (first metal plate) on a rear surface side of the semiconductor chip opposite to the one surface and an electrode provided on a rear surface and the second conductive member are connected by third solder. The semiconductor chip is encapsulated in an sealing resin body (mold resin). One surface of each conductive member on an opposite side to the semiconductor chip forms a heat dissipation surface exposed from the sealing resin body. Hence, the semiconductor device has a double-sided heat dissipation structure capable of dissipating heat of the semiconductor chip toward both surfaces.

According to the configuration in which the metal member is interposed between the semiconductor chip and the first conductive member as described above, the first solder disposed between the semiconductor chip and the metal member may possibly wet and spread along a surface of the metal member and flow into the second solder during reflow soldering. Conversely, the second solder disposed between the metal member and the first conductive member may possibly wet and spread along the surface of the metal member and flow into the first solder during reflow soldering.

In such a case, one of the first solder and the second solder is increased above a desired amount and the other solder is reduced below the desired amount. A variance in amount of solder as above may possibly give rise to inconveniences, such as a solder short circuit caused by an increased amount of solder, a shorted solder life caused by a reduced amount of solder, and contamination of production facilities caused by solder that has overflowed.

Thermal stress is known to increase when the first solder and the electrode produce an obtuse angle in comparison with when a produced angle is an acute angle. For example, in a case where the second solder flows into the first solder and an amount of the first solder increases, cracking may possibly occur in the electrode due to thermal stress.

In particular, the semiconductor device having the double-sided heat dissipation structure described as above includes a radiator on each surface side and it thus becomes necessary to manage a distance between the two heat dissipation surfaces. For a purpose of distance management, reflow soldering is performed by using a slightly larger amount of the second solder in order to absorb irregularities among respective components in height in a thickness direction of the semiconductor chip. Accordingly, the second solder may possibly wet and spread along the surface of the metal member and flow into the first solder during reflow soldering. That is to say, the first solder and the electrode on the one surface may possibly produce an obtuse angle.

PATENT LITERATURE

Patent Literature 1: JP-2007-103909 A

SUMMARY

It is an object of the present disclosure to provide a semiconductor device restricting either first solder or second solder from wetting and spreading toward the other, and a manufacturing method of such a semiconductor device.

According to a first aspect of the present disclosure, a semiconductor device includes: a semiconductor chip having an electrode on one surface; a first conductive member disposed on one surface side of the semiconductor chip; a metal member having a base member made of a metal material and a membrane arranged on a surface of the base member, and disposed between the semiconductor chip and the first conductive member; a first solder disposed between the electrode of the semiconductor chip and the metal member, and connecting the electrode and the metal member; and a second solder disposed between the metal member and the first conductive member, and connecting the metal member and the first conductive member. The membrane has a metal thin film arranged on the surface of the base member and an uneven oxide film having a recess and a protrusion continuously disposed on a surface and made of an oxide of a metal same as a metal which is a main component of the metal thin film. The uneven oxide film is arranged on the metal thin film in at least a part of a connection region of a surface of the metal member, the connection region connecting a first connection region to which the first solder is connected and a second connection region to which the second solder is connected.

According to the semiconductor device as above, the uneven oxide film is provided on the metal thin film in the connection region. Hence, in comparison with a configuration in which the uneven oxide film is absent, that is, a configuration in which a surface of the metal thin film is exposed, wettability to solder can be reduced in a portion to which the uneven oxide film is provided. The surface of the uneven oxide film is of a shape having continuous recesses and protrusions, that is, a rough surface. Hence, wettability to solder can be reduced in comparison with a flat surface. Accordingly, either the first solder or the second solder can be restricted from wetting and spreading along the surface of the metal member and flowing into the other. For example, the second solder can be restricted from flowing into the first solder by stopping wetting and spreading of the second solder by the uneven oxide film.

Alternatively, the uneven oxide film may be a laser beam irradiation film on the surface of the metal thin film. The surface of the metal thin film is melted and evaporated (turned into vapor) by irradiation of a laser beam. The metal thin film melted and turned into vapor is vapor-deposited to a portion where the laser beam has been irradiated and a vicinity of the laser beam irradiated portion. It is confirmed by the present inventors that the uneven oxide film provided with continuous recesses and protrusions on the surface can be formed on the metal thin film by irradiation of a laser beam as above.

According to a second aspect of the present disclosure, a manufacturing method of a semiconductor device including: a semiconductor chip having an electrode on one surface; a first conductive member disposed on one surface side of the semiconductor chip; a metal member having a base member made of a metal material and a membrane arranged on a surface of the base member, and disposed between the semiconductor chip and the first conductive member; a first solder disposed between the electrode of the semiconductor chip and the metal member and connecting the electrode and the metal member; and a second solder disposed between the metal member and the first conductive member, and connecting the metal member and the first conductive member, the membrane having a metal thin film arranged on the surface of the base member and an uneven oxide film having a recess and a protrusion continuously disposed on a surface and made of an oxide of a metal same as a metal which is a main component of the metal thin film, the manufacturing method includes: preparing the base member on which the metal thin film is formed; forming the uneven oxide film on a surface of the metal member in at least a part of a connection region, connecting a first connection region to which the first solder is connected and a second connection region to which the second solder is connected, by irradiating a pulse oscillated laser beam to a surface of the metal thin film; and connecting the electrode of the semiconductor chip and the metal member via the first solder, and connecting the metal member and the first conductive member via the second solder after the forming of the uneven oxide film.

According to the manufacturing method of the semiconductor device as above, the uneven oxide film provided with continuous recesses and protrusions on the surface can be formed by irradiation of a laser beam. Accordingly, either the first solder or the second solder can be restricted from wetting and spreading along the surface of the metal member and flowing into the other. For example, the second solder can be restricted from flowing into the first solder by stopping wetting and spreading of the second solder by the uneven oxide film.

BRIEF DESCRIPTION OF DRAWINGS

The above and other objects, features and advantages of the present disclosure will become more apparent from the following detailed description made with reference to the accompanying drawings. In the drawings:

FIG. 9 is a view showing a result of a first example;

FIG. 10 is a view showing a result of a second example;

FIG. 11 is a view showing a result of a third example;

EMBODIMENTS

Figure 1:
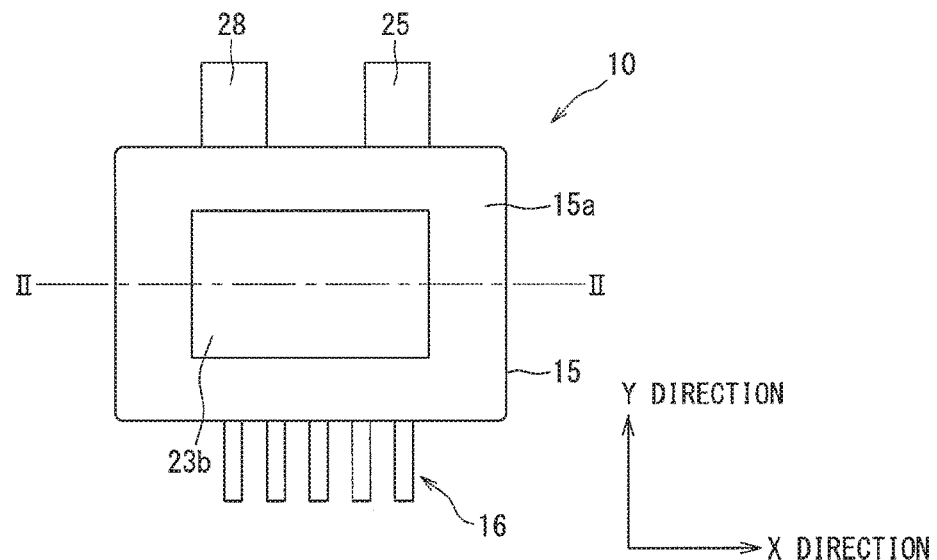
FIG. 1 is a top view showing a schematic configuration of a semiconductor device according to a first embodiment.

Hereinafter, embodiments of the present disclosure will be described with reference to the drawings. In the respective embodiments below, common or related components are labelled with same reference numerals. A thickness direction of a semiconductor chip described below is given as a Z direction and a direction orthogonal to the Z direction is given as an X direction. Also, a direction orthogonal to both of the Z direction and the X direction is given as a Y direction. A shape conforming to an X-Y plane defined by the X direction and the Y direction is given as a planar shape unless specified otherwise.

First Embodiment

Firstly, a schematic configuration of a semiconductor device will be described according to FIG. 1 through FIG. 3.

Figure 2:
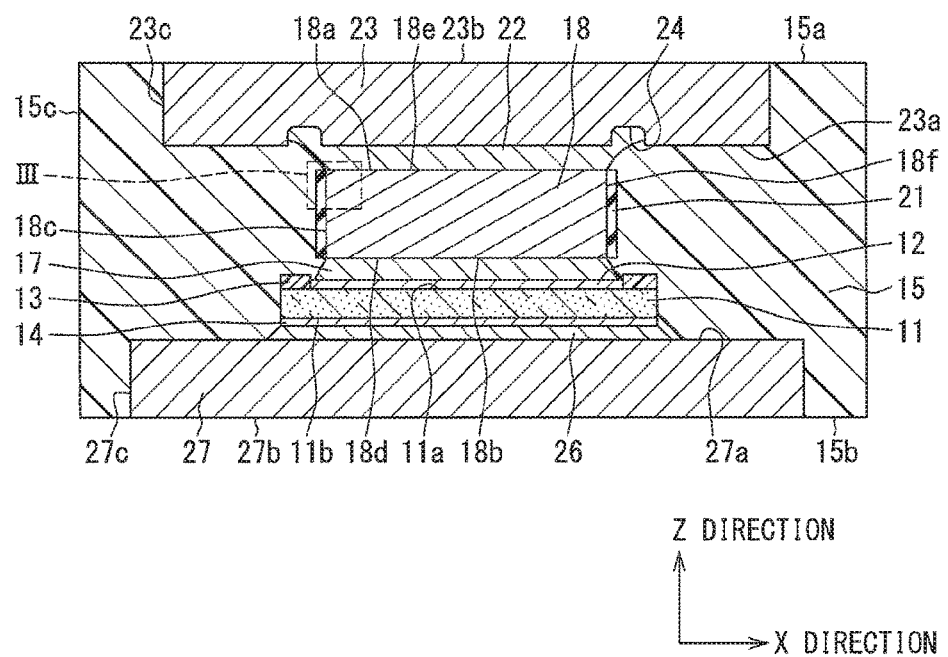
FIG. 2 is a sectional view taken along the line II-II of FIG. 1.
Figure 3:
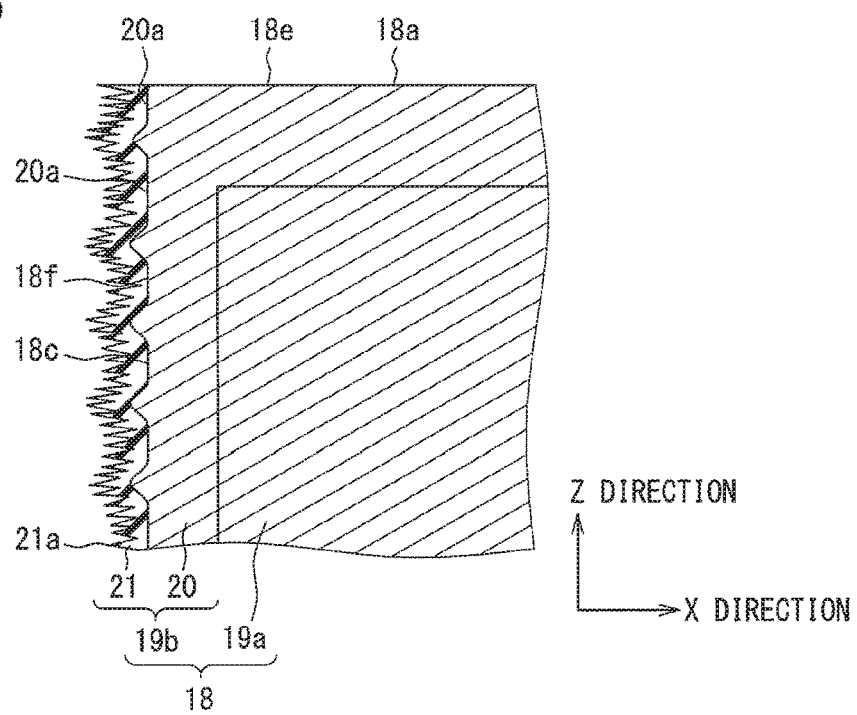
FIG. 3 is an enlarged sectional view of a region III indicated by a broken line in FIG. 2.

As are shown in FIG. 1 and FIG. 2, a semiconductor device 10 includes a semiconductor chip 11, an sealing resin body 15, a terminal 18, a first heat sink 23, and a second heat sink 27. Further, the semiconductor device 10 includes signal terminals 16 and main terminals 25 and 28 as external connection terminals. The semiconductor device 10 as above is used as so-called a 1-in-1 package forming one of six arms included in a three-phase inverter, and incorporated in, for example, an inverter circuit of a vehicle.

The semiconductor chip 11 includes a semiconductor substrate, such as a silicone substrate, provided with a power transistor, such as an insulated gate bipolar transistor (IGBT). In the present embodiment, the semiconductor substrate is provided with an n-channel IGBT and a flywheel diode (FWD) connected in anti-parallel with the IGBT. In short, the semiconductor chip 11 is provided with an RC (Reverse Conducting)-IGBT. The semiconductor chip 11 is flat and formed in substantially a rectangular shape.

The IGBT and the FWD have so-called a vertical structure to let a current flow in the Z direction. The semiconductor chip 11 has an electrode on each of one surface 11a and a rear surface 11b opposite to the one surface 11a in the Z direction. An emitter electrode 12 is provided to the one surface 11a. The emitter electrode 12 corresponds to "an electrode on one surface". The emitter electrode 12 functions also as an anode electrode of the FWD. The emitter electrode 12 is exposed from a protection film 13 disposed to the one surface 11a to protect the IGBT and the FWD. The protection film 13 is made of, for example, at least polyimide. Besides the emitter electrode 12, an unillustrated pad is also exposed from the protection film 13. The pad includes a gate electrode pad and so on.

Meanwhile, a collector electrode 14 is provided substantially all over the rear surface 11b. The collector electrode 14 corresponds to "an electrode on a rear surface". The collector electrode 14 functions also as a cathode electrode of the FWD.

The sealing resin body 15 is made of, for example, epoxy resin. The sealing resin body 15 is flat and formed in substantially a rectangular shape and has one surface 15a orthogonal to the Z direction, a rear surface 15b opposite to the one surface 15a, and side surfaces 15c connecting the one surface 15a and the rear surface 15b. The one surface 15a and the rear surface 15b are, for example, flat surfaces.

The signal terminals 16 are electrically connected to the pad of the semiconductor chip 11 via unillustrated bonding wires. As is shown in FIG. 1, the signal terminals 16 are extended in the Y direction and protrude to an outside of the sealing resin body 15 from one of the side surfaces 15c.

The terminal 18 is connected to the emitter electrode 12 on the semiconductor chip 11 via first solder 17. In the present embodiment, fluxless solder is used as the first solder 17. The terminal 18 corresponds to "a metal member".

The terminal 18 is interposed between the semiconductor chip 11 and the first heat sink 23. The terminal 18 is located at a midpoint in a path of heat conduction and electric conduction between the semiconductor chip 11 and the first heat sink 23. Hence, in order to ensure heat conductivity and electric conductivity, the terminal 18 is chiefly made of a metal material. As is shown in FIG. 3, the terminal 18 has a base member 19a made of a metal material and a membrane 19b provided to a surface of the base member 19a. In the present embodiment, Cu is adopted as a material of the base member 19a.

The terminal 18 is of substantially a rectangular column shape, to be more specific, substantially a square column shape (in other words, substantially a rectangular parallelepiped shape). The terminal 18 has a surface including a first opposing surface 18a opposing the first heat sink 23, a second opposing surface 18b opposing the semiconductor chip 11, and side surfaces 18c connecting the both opposing surfaces 18a and 18b. The first opposing surface 18a and the second opposing surface 18b are referred to also as bottoms of substantially a square column shape. A direction orthogonal to the first opposing surface 18a and the second opposing surface 18b of the terminal 18, that is, a thickness direction of the terminal 18 is substantially parallel to the Z direction.

In the present embodiment, when the surface of the terminal 18 is viewed part by part, substantially the entire second opposing surface 18b forms a first connection region 18d to which the first solder 17 is connected. Likewise, substantially the entire first opposing surface 18a forms a second connection region 18e to which second solder 22 described below is connected. The side surfaces 18c form a connection region 18f connecting the first connection region 18d and the second connection region 18e.

The membrane 19b has a metal thin film 20 provided to the surface of the base member 19a and an uneven oxide film 21 provided with continuous recesses and protrusions on a surface and formed of an oxide of metal same as metal which is a primary component of the metal thin film 20.

The metal thin film 20 is a film made of metal. In the present embodiment, a primary component of the metal thin film 20 is Ni. The metal thin film 20 is formed by, for example, plating or vapor deposition. The metal thin film 20 is formed on the surface of the base member 19a by means of, for example, electroless Ni plating. Besides Ni as a primary component, the metal thin film 20 includes P (phosphorous).

The metal thin plate 20 is provided all over the surface of the base member 19a. As is shown in FIG. 3, recess portions 20a are provided to a surface of the metal thin film 20 in a portion forming the side surfaces 18c of the terminal 18. As will be described below, the recess portions 20a are formed by irradiation of a pulsed oscillation laser beam. For example, one recess portion 20a is formed per pulse. The recess portion 20a corresponds to a spot of a laser beam. The recess portions 20a formed adjacently in a scanning direction of a laser beam continue to each other. A width of each recess portion 20a is 5 μm to 300 μm. A depth of each recess portion 20a is 0.5 μm to 5 μm.

When a depth of the recess portions 20a is less than 0.5 μm, the surface of the metal thin film 20 does not melt sufficiently and is therefore poorly vapor-deposited by irradiation of a laser beam, in which case the uneven oxide film 21 described below is hardly formed. Conversely, when a depth of the recess portions 20a is greater than 5 μm, the surface of the metal thin film 20 readily melts and splashes, in which case melting and splashing dominates over vapor-deposition in film formation and the uneven oxide film 21 is hardly formed, either.

The uneven oxide film 21 is provided on the metal thin film 20. In the present embodiment, the uneven oxide film 21 is provided to the surface of the metal thin film 20 in the portion forming the side surfaces 18c of the terminal 18. The uneven oxide film 21 is provided along an entire circumference of the four side surfaces 18c of the terminal 18. Further, the uneven oxide film 21 is provided all over the respective side surfaces 18c, that is, provided to each entire side surface 18c. The uneven oxide film 21 is thus provided to the connection region 18f.

The uneven oxide film 21 is formed by oxidizing metal forming the metal thin film 20 by irradiating a laser beam to the metal thin film 20. That is to say, the uneven oxide film 21 is a film of an oxide formed on the surface of the metal thin film 20 by oxidizing a top layer of the metal thin film

20. Hence, it can be said that a part of the metal thin film 20 provides the uneven oxide film 21.

In the present embodiment, $Ni_2O_3$ accounts for 80% of components forming the uneven oxide film 21, NiO accounts for 10%, and Ni accounts for 10%. That is to say, a primary component of the uneven oxide film 21 is an oxide of Ni, which is a primary component of the metal thin film 20. An average film thickness of the uneven oxide film 21 is 10 nm to several hundred nm. The uneven oxide film 21 is formed so as to conform to recesses and protrusions on the surface of the metal thin film 20 having the recess portions 20*a*. The recesses and the protrusions are formed at pitches finer than a width of the recess portions 20*a*. In short, extremely fine recesses and protrusions are formed. In other words, multiple protrusion portions 21*a* (column shape) are provided at fine pitches. For example, an average width of the protrusion portions 21*a* is 1 nm to 300 nm and an average interval among the protrusion portions 21*a* is 1 nm to 300 nm.

The first heat sink 23 is connected to the first opposing surface 18*a* of the terminal 18 via the second solder 22. In the present embodiment, fluxless solder is used as the second solder 22. The first heat sink 23 corresponds to "a first conductive member". In the following, the first solder 17 and the second solder 22 are referred to also as solders 17 and 22.

The first heat sink 23 exerts a heat dissipation function to dissipate heat generated in the semiconductor chip 11 to an outside of the semiconductor device 10 and a function to electrically relay between the semiconductor chip 11 and the main terminal 25 described below. The first heat sink 23 as above is made of a material outperforming the second solder 22 in thermal conductivity. For example, metal materials having excellent thermal conductivity and electric conductivity, such as Cu, Cu alloy, and Al alloy, can be adopted. In the present embodiment, the first heat sink 23 is made of Cu.

A opposing surface 23*a* of the first heat sink 23 opposing the terminal 18 is covered with the sealing resin body 15. Meanwhile, an opposite surface to the opposing surface 23*a* forms a heat dissipation surface 23*b* exposed from the one surface 15*a* of the sealing resin body 15. The heat dissipation surface 23*b* is substantially flush with the one surface 15*a*. Side surfaces 23*c* connecting the opposing surface 23*a* and the heat dissipation surface 23*b* are also covered with the sealing resin body 15.

The opposing surface 23*a* of the first heat sink 23 is provided with a groove 24 so as to surround the terminal 18 when viewed in projection in the Z direction. The groove 24 of a ring shape is provided so as to absorb (store) an excess of the second solder 22 flowing out from an opposing region of the first heat sink 23 and the terminal 18 during reflow soldering. The second solder 22 is disposed in the groove 24 and to a region surrounded by the groove 24 when viewed in projection in the Z direction.

The main terminal 25 is coupled to the first heat sink 23. The main terminal 25 is electrically connected to the emitter electrode 12 on the semiconductor chip 11 via the terminal 18 and the first heat sink 23. The main terminal 25 is extended from the first heat sink 23 in the Y direction oppositely to the signal terminals 16. The main terminal 25 protrudes to an outside of the sealing resin body 15 from one of the side surfaces 15*c* opposite to the side surface 15*c* from which the signal terminals 16 protrude. The main terminal 25 may be formed integrally with the first heat sink 23 as a part of a lead frame or the main terminal 25 may be provided as a separate member and connected to the first heat sink 23.

The second heat sink 27 is connected to the collector electrode 14 on the semiconductor chip 11 via third solder 26. The second heat sink 27 corresponds to "a second conductive member". As with the first heat sink 23, the second heat sink 27 also exerts a heat dissipation function to dissipate heat generated in the semiconductor chip 11 to the outside of the semiconductor device 10 and a function to electrically relay between the semiconductor chip 11 and the main terminal 28 described below. In the present embodiment, the second heat sink 27 is made of Cu.

A opposing surface 27*a* of the second heat sink 27 opposing the semiconductor chip 11 is covered with the sealing resin body 15. Meanwhile, an opposite surface to the opposing surface 27*a* forms a heat dissipation surface 27*b* exposed from the rear surface 15*b* of the sealing resin body 15. The heat dissipation surface 27*b* is substantially flush with the rear surface 15*b*. Side surfaces 27*c* connecting the opposing surface 27*a* and the heat dissipation surface 27*b* are also covered with the sealing resin body 15.

The main terminal 28 is coupled to the second heat sink 27. The main terminal 28 is electrically connected to the collector electrode 14 on the semiconductor chip 11 via the second heat sink 27. The main terminal 28 is extended from the second heat sink 27 in the Y direction in a same direction as the main terminal 25. The main terminal 28 protrudes to an outside of the sealing resin body 15 from one of the side surfaces 15*c*, from which the main terminal 25 also protrudes. The main terminal 28 may be formed integrally with the second heat sink 27 as a part of the lead frame or the main terminal 28 may be provided as a separate member and connected to the second heat sink 27.

An example of a manufacturing method of the semiconductor device 10 configured as above will now be described according to FIG. 4 through FIG. 7.

Firstly, respective components forming the semiconductor device 10 are prepared. That is to say, the semiconductor chip 11, the signal terminals 16, the terminal 18, the first heat sink 23, the main terminal 25, the second heat sink 27, and the main terminal 28 are prepared separately. Among preparing processes of the respective components, a preparing process of the terminal 18 will now be described. The preparing process of the terminal 18 is referred to also as an irradiation process because the process involves irradiation of a laser beam as will be described below. The preparing process of the terminal 18 is referred to also as a membrane forming process because the membrane 19*b* is formed in the process.

In the preparing process of the terminal 18, the terminal 18 having the base member 19*a* and the metal thin film 20 of the membrane 19*b* is prepared first. In the present embodiment, the metal thin film 20 is formed all over the surface of the base member 19*a* by means of electroless Ni plating. A target value of a film thickness of the metal thin film 20 is, for example, about 10 μm.

Subsequently, the surface of the metal thin film 20 on the side surfaces 18*c* of the terminal 18 is melted and evaporated by irradiating a pulsed oscillation laser beam to the surface of the metal thin film 20. More specifically, a surface portion of the metal thin film 20 is melted and evaporated (turned into vapor) by irradiation of a laser beam and suspended in outside air. A pulsed oscillation laser beam is adjusted to have energy density higher than 0 $J/cm^2$ and equal to or lower than 100 $J/cm^2$ and a pulse width of 1 μsec or less. In order to satisfy the condition as above, a YAG laser, a $YVO_4$ laser, a fiber laser, and so on can be adopted. In the case of a YAG laser, for example, energy density only has to be 1 $J/cm^2$ at minimum. In the case of the metal thin film 20 formed by means of electroless Ni plating, the metal thin film 20 can be processed even when energy density is as low as about 5 J/cm$^2$ as will be described below. Energy density is referred to also as pulse fluence.

Figure 4:
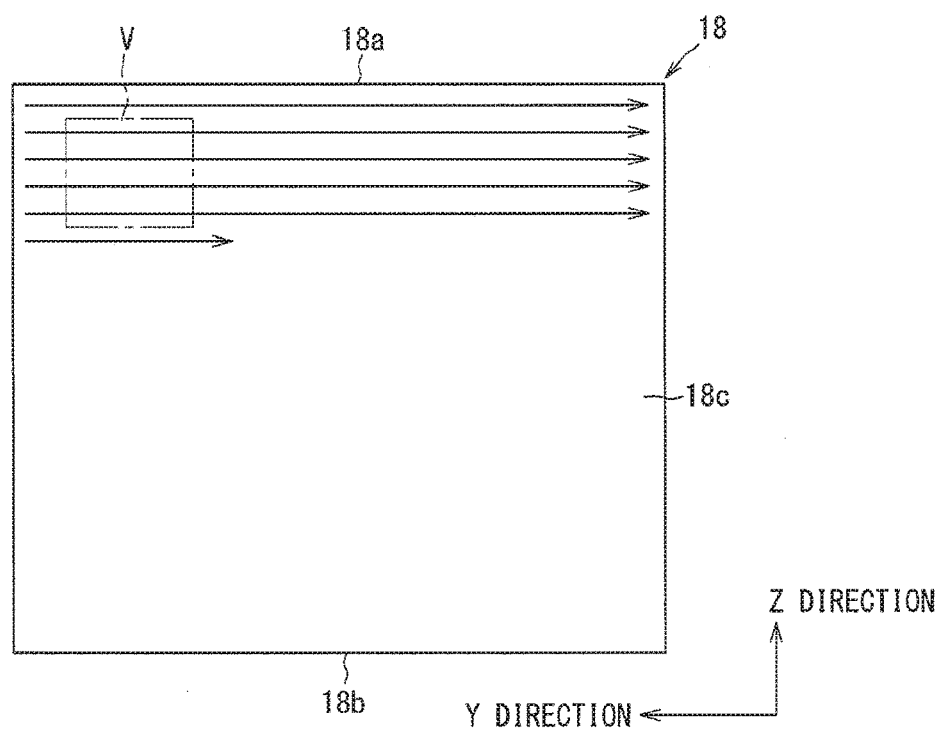
FIG. 4 is a top view showing a film forming method of an uneven oxide film.

By moving a light source of a laser beam and the terminal 18 relatively to each other during irradiation of a laser beam, as is shown in FIG. 4, a laser beam is applied sequentially to multiple positions on the side surface 18c. It does not matter whether the light source of a laser beam is moved or the terminal 18 is moved. Further, a laser beam may be scanned by a rotational operation of a mirror. That is to say, a laser beam may be applied sequentially to multiple positions on the side surface 18c by scanning a laser beam.

An irradiation angle of a laser beam with respect to an irradiation surface is not particularly limited. For example, a laser beam is applied to any side surface 18c of the terminal 18 in a direction orthogonal to the side surface 18c. In the case of the side surfaces 18c orthogonal to the X direction, a laser beam is applied sequentially to a line of multiple positions by scanning the laser beam in the Y direction. In the case of the side surfaces 18c orthogonal to the Y direction, a laser beam is applied sequentially to a line of multiple positions by scanning the laser beam in the X direction.

In the case of the side surfaces 18c orthogonal to the X direction, for example, when irradiation of a laser beam to the side surface 18c from end to end is completed by scanning the laser beam in the Y direction, an irradiation region of a laser beam is displaced in the Z direction. That is, a laser beam is scanned in the Z direction. A laser beam is applied from end to end by scanning the laser beam in the Y direction in the same manner as above. By repeating such an operation, a laser beam is applied substantially across the entire side surface 18c. That is to say, a laser beam is applied to lattice points at predetermined pitches in Y-Z coordinates.

In the present embodiment, a laser beam is scanned in the Y direction in such a manner that a spot (irradiation region per pulse) of a laser beam partially overlaps an adjacent spot of the laser beam in the Y direction. Also, a laser beam is scanned in the Z direction in such a manner that adjacent spots of a laser beam partially overlap each other in the Z direction. A laser beam is scanned on the side surfaces 18c orthogonal to the Y direction in the same manner as above. The uneven oxide film 21 is thus formed substantially all over the respective side surfaces 18c. FIG. 4 shows a state in which a laser beam has been applied to a part of the side surface 18c.

The multiple recess portions 20a are provided to the surface of the metal thin film 20 by irradiating with a laser beam the surface of the metal thin film 20 for the surface to melt and turn into vapor. Also, an average thickness of the metal thin film 20 on the side surfaces 18c is less than an average thickness of the metal thin film 20 on the first opposing surface 18a and the second opposing surface 18b neither of which is irradiated by a laser beam.

Subsequently, a melted portion of the metal thin film 20 is solidified. More specifically, the metal thin film 20 which is melted and turned into vapor is vapor-deposited to a portion to which a laser beam has been applied and a vicinity of the laser beam applied portion. By vapor-depositing the metal thin film 20 which has been melted and turned into vapor in the manner as above, the uneven oxide film 21 provided with continuous recesses and protrusions is formed on the surface of the metal thin film 20. According to the processes as above, the membrane 19b including the uneven oxide film 21 in addition to the metal thin film 20 is formed on the base member 19a and preparation of the terminal 18 is completed.

Figure 5:
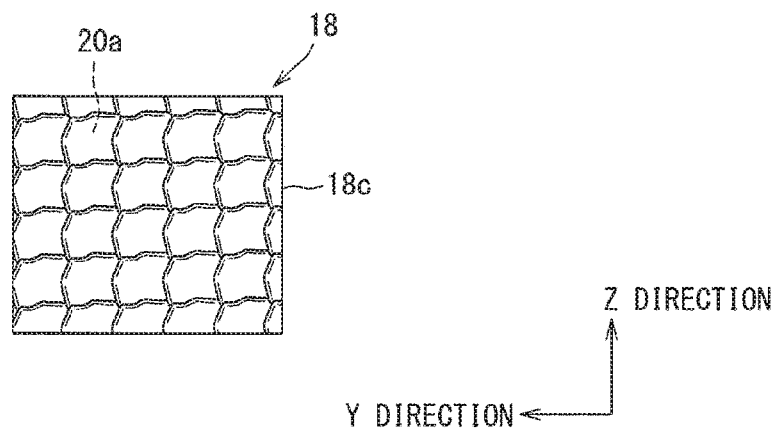
FIG. 5 is an enlarged top view of a region V of FIG. 4.

As has been described, a laser beam is scanned, for example, in the Y direction in such a manner that spots of the laser beam partially overlap one another in the Y direction and also a laser beam is scanned in the Z direction in such a manner that spots of the laser beam overlap one another in the Z direction. Accordingly, the multiple recess portions 20a formed correspondingly to spots of a laser beam continue not only in the Y direction but also in the Z direction. Consequently, as is shown in FIG. 5, laser irradiation marks (recess portions 20a) left on the side surfaces 18c are scaly marks.

An assiduous study conducted by the inventors reveals that the uneven oxide film 21 is not formed by irradiation of a laser beam when energy density is 150 J/cm$^2$ or 300 J/cm$^2$ higher than 100 J/cm$^2$. The study also reveals that the uneven oxide film 21 is not formed, either, by irradiation of a continuous oscillation laser beam instead of a pulsed oscillation laser beam.

Subsequently, a connection process using the first solder 17 and the second solder 22 is performed. In the present embodiment, the semiconductor chip 11 is first disposed on the opposing surface 27a of the second heat sink 27 via the third solder 26 (for example, solder foil). Subsequently, the terminal 18 preliminarily applied with the solders 17 and 22 as preparatory solder on the both surfaces is disposed on the semiconductor chip 11 by locating the first solder 17 on the side of the semiconductor chip 11. A slightly larger amount of the second solder 22 is applied in order to absorb tolerance irregularities in height in the semiconductor device 10.

By applying reflow soldering (first reflow soldering) to the solders 17, 22, and 26 while the components are layered as above, the semiconductor chip 11 and the second heat sink 27 are connected via the third solder 26 and the semiconductor chip 11 and the terminal 18 are connected via the first solder 17. Herein, a connection target of the second solder 22, namely, the first heat sink 23 is not layered. Hence, the second solder 22 forms a bank shape rising toward a top at a center of the first opposing surface 18a of the terminal 18 due to surface tension.

Figure 6:
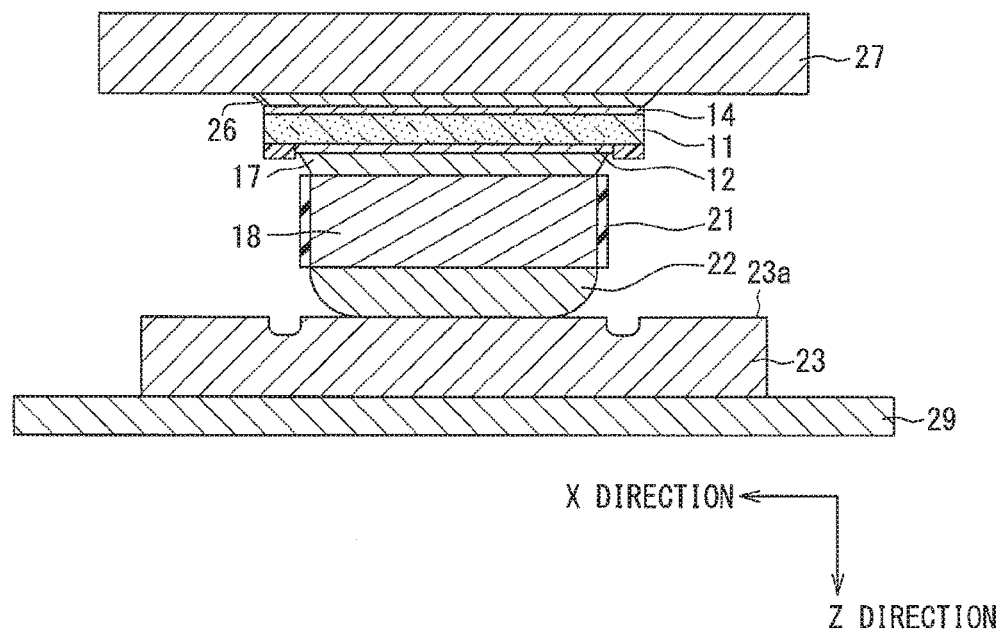
FIG. 6 is a sectional view showing second solder immediately before reflow soldering.

Subsequently, the signal terminals 16 and the pad of the semiconductor chip 11 are connected by bonding wires. As is shown in FIG. 6, the first heat sink 23 is disposed on a seat 29 with the opposing surface 23a faced up and the connection body integrated into one unit by the first reflow soldering is disposed on the opposing surface 23a of the first heat sink 23 with the terminal 18 faced down.

Figure 7:
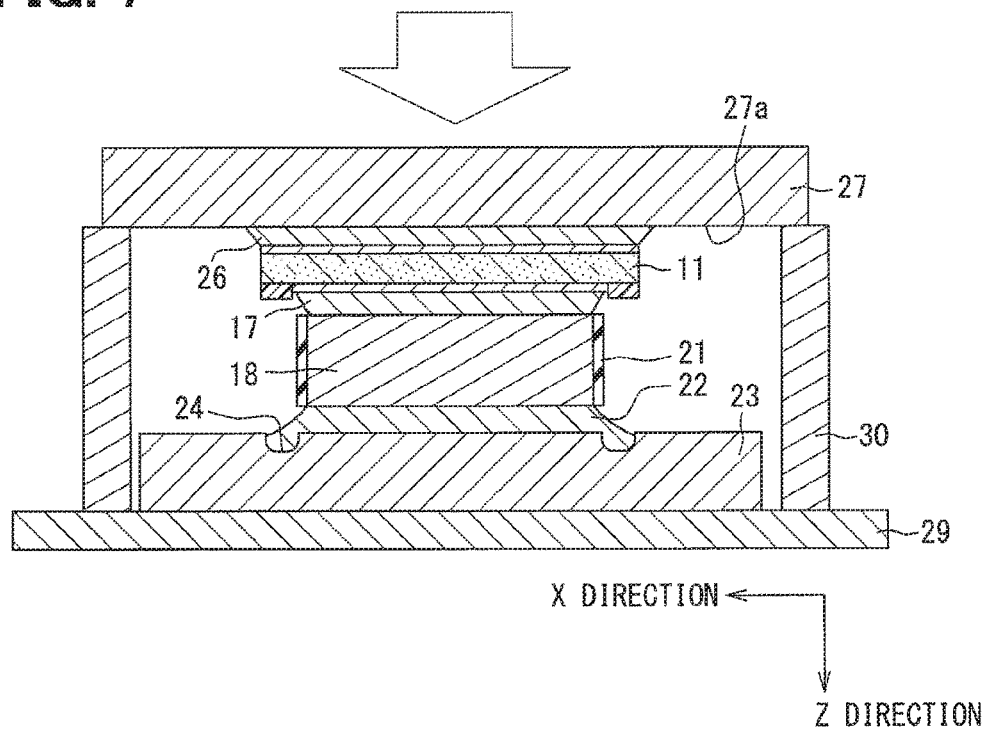
FIG. 7 is a sectional view showing the second solder during reflow soldering.

Subsequently, as is shown in FIG. 7, reflow soldering (second reflow soldering) is applied while the first heat sink 23 is placed on a lower side. A height of the semiconductor device 10 is adjusted to be a predetermined height by applying a load to the structural body. In the present embodiment, a height of the semiconductor device 10 is adjusted to be a predetermined height by interposing a spacer 30 between the seat 29 and the opposing surface 27a of the second heat sink 27 so as to make contact with both of the seat 29 and the opposing surface 27a. That is to say, the seat 29 and the spacer 30 function as a height adjustment member.

As has been described, a slightly larger amount of the second solder 22 is supplied to a space between the terminal 18 and the first heat sink 23. Hence, the second solder 22 between the terminal 18 and the first heat sink 23 does not become insufficient during the second reflow soldering and is therefore capable of connecting the terminal 18 and the first heat sink 23 in a reliable manner. Also, an excess of the second solder 22 is pushed out from a space between the terminal 18 and the first heat sink 23 due to application of the load or the like. In the present embodiment, however, the uneven oxide film 21 is provided substantially all over the side surfaces 18c of the terminal 18. Hence, an excess of the second solder 22 does not wet and spread along the side surfaces 18c of the terminal 18 but wets and spreads along the opposing surface 23a of the first heat sink 23 and is stored into the groove 24.

The first reflow soldering and the second reflow soldering are vacuum reflow soldering under a hydrogen atmosphere. Accordingly, a native oxide film on a metal surface unwanted for soldering, for example, a native oxide film formed on surfaces of the terminal 18, the first heat sink 23, and the second heat sink 27 can be removed by means of reduction. Hence, fluxless solder can be used as the respective solders 17, 22, and 26. In addition, development of voids in the solders 17, 22, and 26 can be restricted by pressure reduction. The uneven oxide film 21 also becomes thinner due to reduction. Hence, the uneven oxide film 21 having a desired thickness is first formed by irradiation of a laser beam so as not to let the uneven oxide film 21 disappear by reduction.

After the connection process ends, the sealing resin body 15 is molded by means of transfer molding. In the present embodiment, the sealing resin body 15 is provided so as to fully cover the respective heat sinks 23 and 27. In such a case, the heat dissipation surfaces 23b and 27b of the heat sinks 23 and 27, respectively, are exposed by cutting out the molded sealing resin body 15 with parts of the respective heat sinks 23 and 27.

Alternatively, the sealing resin body 15 may be molded while the heat dissipation surfaces 23b and 27b of the heat sinks 23 and 27, respectively, are pressed against and firmly adhered to a cavity wall surface of a molding die. In such a case, the heat dissipation surfaces 23b and 27b are exposed from the sealing resin body 15 when molding of the sealing resin body 15 is completed. Hence, cutting work following the molding can be omitted.

The semiconductor device 10 can be obtained by removing an unwanted portion from the lead frame.

An effect of the semiconductor device 10 as above will now be described.

In the present embodiment, the uneven oxide film 21 is formed on the surface of the terminal 18 so as to be provided to the side surfaces 18c. That is to say, the uneven oxide film 21 is provided to the connection region 18f connecting the first connection region 18d and the second connection region 18e. By providing the uneven oxide film 21 in the manner as above, wettability to the solders 17 and 22 can be reduced in comparison with a configuration in which the uneven oxide film 21 is absent, that is, a configuration in which the surface of the metal thin film 20 is exposed.

Owing to the presence of the uneven oxide film 21, fine recesses and protrusions are formed on the surface of the terminal 18. The solders 17 and 22 hardly fit into such a rough surface. Accordingly, a contact area of a part of the solders 17 and 22 and the terminal 18 becomes smaller and the part of the solders 17 and 22 is formed into a spherical shape due to surface tension. In short, an angle of contact becomes larger. Hence, wettability to the solders 17 and 22 can be reduced in a portion to which the uneven oxide film 21 is provided.

Owing to the configurations as above, either the first solder 17 or the second solder 22 can be restricted from wetting and spreading along the surface of the terminal 18 and flowing into the other. In the present embodiment, a slightly larger amount of the second solder 22 is used in order to absorb height. However, wetting and spreading of the second solder 22 can be stopped by the uneven oxide film 21. Hence, the second solder 22 can be restricted from flowing into the first solder 17. That is to say, an inconvenience that an amount of the first solder 17 is increased and the first solder 17 and one surface of the emitter electrode 12 orthogonal to the Z direction produce an obtuse angle can be restricted. Consequently, cracking occurring in the emitter electrode 12 due to thermal stress can be restricted.

In the present embodiment, the uneven oxide film 21 is provided to the side surfaces 18c of the terminal 18. The side surfaces 18c are located at positions more distant from the emitter electrode 12 in the Z direction than the first connection region 18d. Also, the side surfaces 18c are located at positions more distant from the first heat sink 23 in the Z direction than the second connection region 18e. Hence, a capillary phenomenon does not have to be concerned as to wetting and spreading of the solders 17 and 22 along the side surfaces 18c. Hence, an inconvenience that the effect of the uneven film 21 is cancelled out and weakened by a capillary phenomenon can be restricted.

A contact area to the sealing resin body 15 is increased by providing the uneven oxide film 21. Further, an anchoring effect is exerted by the sealing resin body 15 that clings to the protrusion portions 21a of the uneven oxide film 21. Hence, adhesion between the terminal 18 and the sealing resin body 15 can be enhanced, which can in turn restrict separation of the sealing resin body 15.

The present embodiment has described a case where the uneven oxide film 21 is provided all over the side surfaces 18c of the terminal 18. However, a range of the uneven oxide film 21 provided to the side surfaces 18c is not limited to the range specified in the case described above. The side surfaces 18c form the connection region 18f. Hence, by providing the uneven oxide film 21 to at least a part of the side surfaces 18c, either the first solder 17 or the second solder 22 can be restricted from wetting and spreading toward the other. It is more preferable to provide the uneven oxide film 21 along an entire circumference of the side surfaces 18c. In such a case, wetting and spreading of either the first solder 17 or the second solder 22 toward the other can be restricted in any of the four side surfaces 18c.

Figure 8:
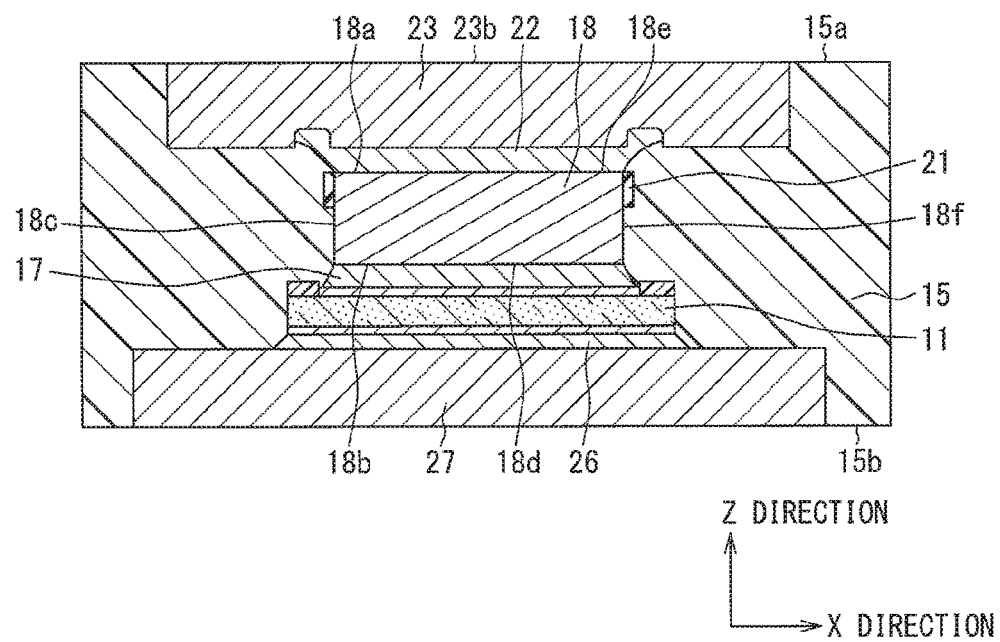
FIG. 8 is a sectional view showing a first modification.

For example, according to a first modification shown in FIG. 8, the uneven oxide film 21 may be provided to the respective side surfaces 18c of the terminal 18 only in a partial region from an end on a side of the first opposing surface 18a. However, an effect of restricting either the first solder 17 or the second solder 22 from flowing into the other during reflow soldering is thought to be higher when the uneven oxide film 21 is longer in the Z direction, that is, wider. It is therefore preferable to provide the uneven oxide film 21 all over the respective side surfaces 18c as described above.

Specific examples confirmed by the inventors by tests or the like will now be described.

First Example

The inventors have confirmed a relation of presence or absence of the uneven oxide film 21 and a formation range of the uneven oxide film 21 with respect to solder wetting, a result of which is set forth in FIG. 9. Evaluation is made by manufacturing the semiconductor device 10 according to the manufacturing method described above. An amount of the second solder 22 with which wetting and spreading to the terminal 18 do not occur in the absence of the uneven oxide film 21 is given as a reference amount, and a comparison is made between the reference amount and three times the reference amount. Also, comparisons are made by preparing the terminals 18 provided with the uneven oxide film 21 formed in different formation ranges, that is, all over the side surface 18c, half the side surface 18c from the end on the side of the first opposing surface 18a, and one third the side surface 18c from the end on the side of the first opposing surface 18a. The uneven oxide film 21 used herein is formed by irradiating the metal thin film 20 formed by means of electroless Ni plating with a laser beam at energy density of 12 J/cm$^2$.

As is set forth in FIG. 9, in a case where the uneven oxide film 21 is absent, when an amount of the second solder 22 is increased by three times, the second solder 22 wets and spreads along the side surface 18c of the terminal 18 and flows into the first solder 17. On the contrary, in a case where the uneven oxide film 21 is provided all over the side surface 18c as described in the present embodiment, even when an amount of the second solder 22 is increased by three times, the second solder 22 does not wet and spread to the terminal 18.

In a case where the uneven oxide film 21 is provided to half the side surface 18c from the end on the side of the first opposing surface 18a, even when an amount of the second solder 22 is increased by three times, the second solder 22 does not wet and spread to the terminal 18. In a case where the uneven oxide film 21 is provided to one third the side surface 18c from the end on the side of the first opposing surface 18a, even when an amount of the second solder 22 is increased by three times, the second solder 22 does not wet and spread to the terminal 18, either.

It thus becomes obvious that wettability to the solders 17 and 22 can be reduced by providing the uneven oxide film 21 in comparison with a configuration in which the surface of the metal thin film 20 is exposed. It also becomes obvious that the second solder 22 can be restricted from wetting and spreading to the terminal 18 by providing the uneven oxide film 21 to the terminal 18 in at least a partial range from the end on the side of the first opposing surface 18a.

Second Example

The inventors have confirmed a relation of presence or absence of the metal thin film 20, types of the metal thin film 20, presence or absence of the uneven oxide film 21, and an occurrence frequency of solder bridging, a result of which is set forth in FIG. 10. Evaluation is made by manufacturing the semiconductor device 10 according to the manufacturing method described above. That is to say, the uneven oxide film 21 is formed by applying a laser beam to the metal thin film 20 at energy density of 6 J/cm$^2$ followed by soldering by means of vacuum reflow soldering under hydrogen atmosphere. Evaluation is made with the metal thin film 20 formed by means of electric Ni plating and the metal thin film 20 formed by means of electroless Ni plating.

Also, evaluation is made for each sample as to a material tolerance target value (hereinafter, referred to as a material tolerance Typ) and a material tolerance max. The material tolerance Typ indicates a state when thicknesses of the respective components forming the semiconductor device 10, namely, the semiconductor chip 11, the terminal 18, the first heat sink 23, and the second heat sink 27, are set to target values of corresponding material tolerances. In order to form the second solder 22, a single sheet of solder foil having a predetermined thickness is used. Meanwhile, in the case of samples with the material tolerance max, in order to simulate an outflow of the second solder 22 when respective thicknesses of the semiconductor chip 11, the terminal 18, the first heat sink 23, and the second heat sink 27 are set to maximum values (upper limit values) of corresponding material tolerances, one and half sheets of the solder foil are used to form the second solder 22. A confirmation is made as to whether the second solder 22 wets and spreads along the side surfaces 18c of the terminal 18 and forms a bridge to the first solder 17.

As is set forth in FIG. 10, in a case where the metal thin film 20 is absent, that is, in a case where the terminal 18 is formed of the base member 19 alone, a bridge is formed 5 out of 172 times even with the material tolerance Typ. In a case with the material tolerance max, a bride is formed 2 out of 2 times. In a case where the metal thin film 20 is formed by means of electric Ni plating and the uneven oxide film 21 is absent, a bridge is formed 0 out of 226 times with the material tolerance Typ. On the contrary, in the case with the material tolerance max, a bridge is formed 2 out of 2 times. In a case where the metal thin film 20 is formed by means of electric Ni plating and the uneven oxide film 21 is present, a bridge is formed 0 out of 24 times with the material tolerance Typ. On the contrary, in the case with the material tolerance max, a bridge is formed 4 out of 4 times.

In a case where the metal thin plate 20 is formed by means of electroless Ni plating and the uneven oxide film 21 is absent, a bridge is formed 0 out of 4 times with the material tolerance Typ. On the contrary, in the case with the material tolerance max, a bridge is formed 6 out of 6 times. In a case where the metal thin film 20 is formed by means of electroless Ni plating and the uneven oxide film 21 is present, a bride is formed 0 out of 4 times with the material tolerance Typ. In the case with the material tolerance max, too, a bridge is formed 0 out of 12 times.

It thus becomes obvious that by forming the uneven oxide film 21 by applying a laser beam to the metal thin film 20 formed by means of electroless Ni plating, it is effective to restrict a bridge formation, that is, to reduce wettability to the solders 17 and 22.

Third Example

The inventors have confirmed a relation of energy density and solder wetting, a result of which is set forth in FIG. 11. Evaluation is made by manufacturing the semiconductor device 10 according to the manufacturing method described above. Also, a laser beam is applied across the entire side surfaces 18c of the terminal 18. In addition, 0.1-mm-thick SnCuNiP containing Ni-balls is used as the second solder 22.

As is set forth in FIG. 11, in a case where the metal thin film 20 is formed by means of electric Ni plating, wetting and spreading of the solders 17 and 22 are confirmed across the entire side surfaces 18c which are worked surfaces when energy density is 2 J/cm$^2$. Wetting and spreading of the solders 17 and 22 are confirmed in a part of the side surfaces 18c when energy density is 4 to 10 J/cm$^2$. The solders 17 and 22 do not wet and spread along the side surfaces 18c when energy density is 12 J/cm$^2$ or above.

On the contrary, in a case where the metal thin film 20 is formed by means of electroless Ni plating, wetting and spreading of the solders 17 and 22 are confirmed across the entire side surfaces 18c when energy density is 2 J/cm$^2$. However, when energy density is 4 J/cm$^2$ or above, the solders 17 and 22 do not wet and spread along the side surfaces 18c. Scaly laser irradiation marks (recess portions 20a) shown in FIG. 5 are hardly noticeable when energy density is 2 J/cm$^2$ and scaly laser irradiation marks (recess portions 20a) are confirmed when energy density is 4 J/m$^2$ or above.

It thus becomes obvious that in the case of the metal thin film 20 formed by means of electroless Ni plating, wettability to the solders 17 and 22 can be reduced by irradiation of a laser beam at lower energy. In the case of the metal thin film 20 formed by mean of electric Ni plating, although energy is higher than energy of the electroless Ni plating, it becomes obvious that wettability to the solders 17 and 22 can be reduced by irradiation of a laser beam at energy lower than 100 J/cm$^2$.

Fourth Example

Figure 12:
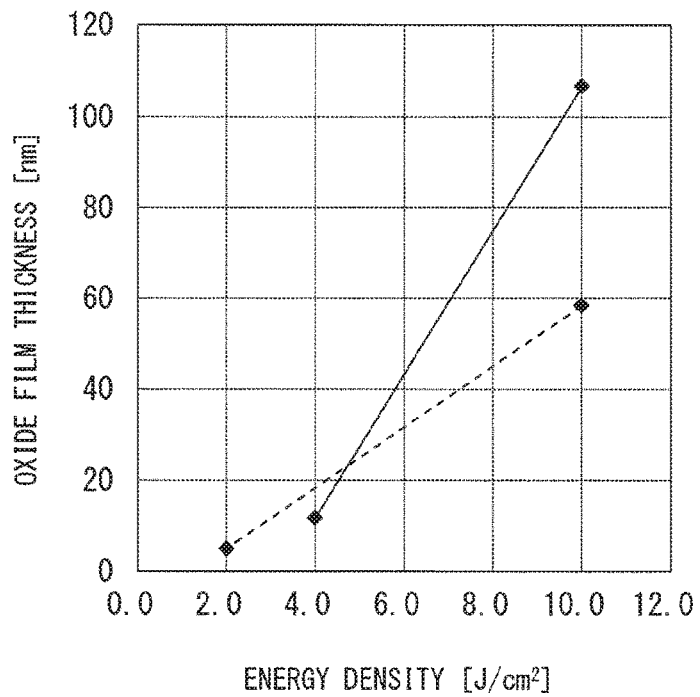
FIG. 12 is a view showing a result of a fourth example.

The inventors have confirmed a relation of energy density and a film thickness of the uneven oxide film 21, a result of which is set forth in FIG. 12. In FIG. 12, the metal thin film 20 formed by means of electroless Ni plating is indicated by a solid line and the metal thin film 20 formed by means of electric Ni plating is indicated by a broken line. A film thickness of the uneven oxide film 21 is measured by Auger electron spectroscopy. An oxide film thickness set forth in FIG. 12 is an average value of a film thickness of the uneven oxide film 21 when n=5.

As is set forth in FIG. 12, in the case of the metal thin film 20 formed by means of electroless Ni plating, it becomes obvious that an oxide film thickness decreases when energy density of an applied laser beam is low whereas the oxide film thickness increases when energy density is high. To be more specific, an oxide film thickness is about 11 nm when energy density is 4 J/cm$^2$ and an oxide film thickness is about 108 nm when energy density is 10 J/cm$^2$.

Likewise, in the case of the metal thin film 20 formed by means of electric Ni plating, too, it becomes obvious that an oxide film thickness decreases when energy density of an applied laser beam is low whereas an oxide film thickness increases when energy density is high. To be more specific, an oxide film thickness is about 5 nm when energy density is 2 J/cm$^2$ and an oxide film thickness is about 60 nm when energy density is 10 J/cm$^2$.

It thus becomes obvious that a film thickness of the uneven oxide film 21 becomes thicker with the metal thin film 20 formed by means of electroless Ni plating than with the metal thin film 20 formed by means of electric Ni plating under a same laser beam irradiation condition. Such a difference is thought to be attributed to a fact that, although it depends on an amount of P content, a melting point of the metal thin film 20 (Ni—P) formed by means of electroless Ni plating is about 800 degrees whereas a melting point of the metal thin film 20 (Ni) formed by means of electric Ni plating is about 1450 degrees. Because a melting point of the metal thin film 20 formed by means of electroless Ni plating is lower, it is thought that the metal thin film 20 melts and vaporizes with a laser beam at low energy and hence a film thickness of the uneven oxide film 21 increases.

Fifth Example

Figure 13:
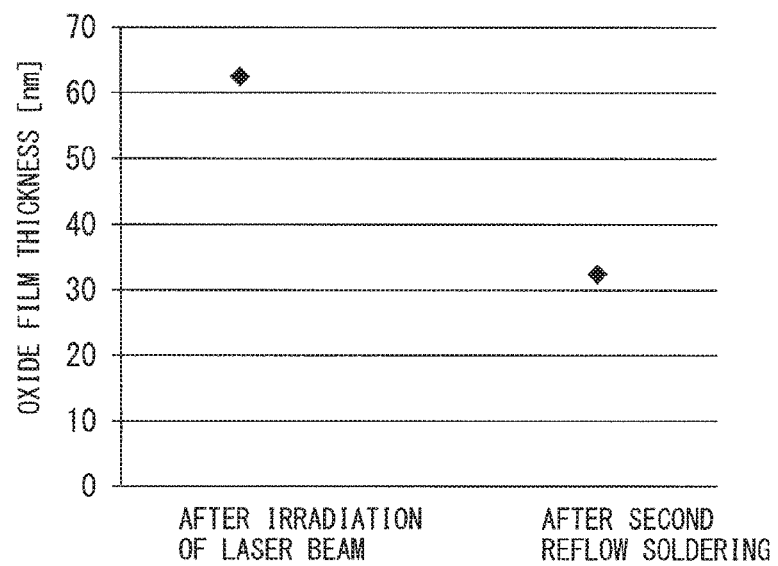
FIG. 13 is a view showing a result of a fifth example.

The inventors have confirmed a relation of a film thickness of the uneven oxide film 21 after laser beam irradiation and a film thickness of the uneven oxide film 21 after the second reflow soldering, a result of which is set forth in FIG. 13. Evaluation is made by manufacturing the semiconductor device 10 according to the manufacturing method described above. A film thickness of the uneven oxide film 21 is measured by Auger electron spectroscopy. The uneven oxide film 21 is formed by applying a laser beam at 7 J/cm$^2$ to the metal thin film 20 formed by means of electroless Ni plating. An oxide film thickness set forth in FIG. 13 is an average value of a film thickness of the uneven oxide film 21 when n=6.

As is set forth in FIG. 13, an oxide film thickness after irradiation of a laser beam is about 62 nm. Meanwhile, an oxide film thickness after the second reflow soldering is about 33 nm. That is to say, by applying reflow soldering under reduction atmosphere, about 30-nm-thick oxide film is reduced. In other words, approximately half the uneven oxide film 21 is reduced. However, confirmation made on wettability to the solders 17 and 22 reveals that the solders 17 and 22 do not wet and spread after irradiation of the laser beam and also after the second reflow soldering.

It thus becomes obvious that a film thickness of the uneven oxide film 21 is reduced by reflow soldering under a reduction atmosphere. A variance in oxide film thickness in the case of the metal thin film 20 formed by means of electric Ni plating is not evaluated. However, an oxide film thickness of the uneven oxide film 21 on the metal thin film 20 formed by means of electric Ni plating is also thought to be reduced under a reduction atmosphere in the same manner as above.

From the results described in Second through Fifth Examples (FIG. 10 through FIG. 13), it is understood that in the case of the metal thin film 20 formed by means of electric Ni plating, the uneven oxide film 21 formed when energy density is 12 J/cm$^2$ or below is thin, and it is therefore thought that the uneven oxide film 21 thick enough to restrict wetting and spreading of the solders 17 and 22 disappears by reduction during the reflow soldering. Hence, by adopting the metal thin film 20 chiefly made of metal having a low melting point, such as the metal thin film 20 formed by means of electroless Ni plating, a film thickness of the uneven oxide film 21 can be increased with a laser beam at low energy.

Sixth Example

Figure 14:
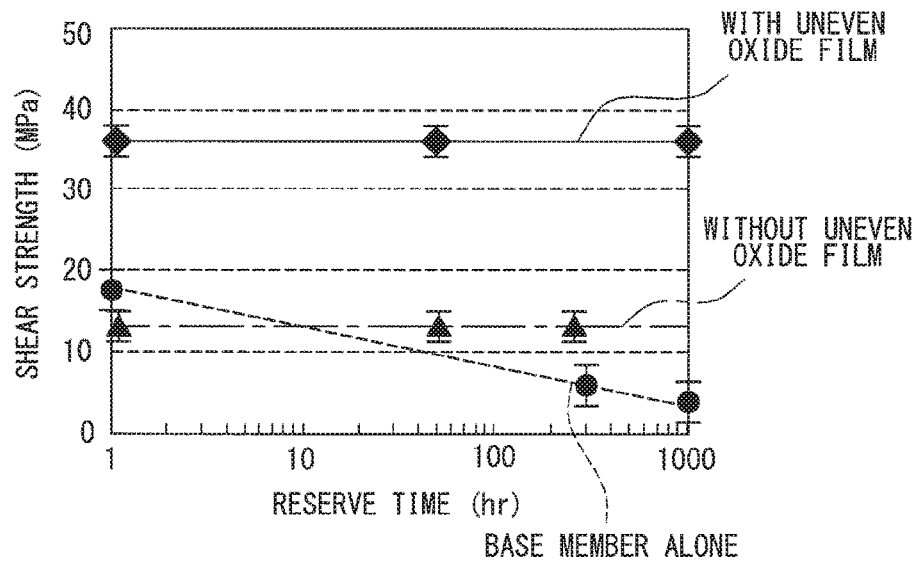
FIG. 14 is a view showing a result of a sixth example.

The inventors have evaluated shear strength in a case where the terminal 18 is formed of the base member 19 alone, a case where an uneven oxide film is absent, and a case where an uneven oxide film is present, a result of which is set forth in FIG. 14. In FIG. 14, the case with the uneven oxide film is indicated by a solid line, the case with the base member 19 alone is indicated by a broken line, and the case without the uneven oxide film (with the metal thin film 20) is indicated by an alternate long and short dash line. The metal thin film 20 formed by means of electroless Ni plating is used in both of the cases with and without the uneven oxide film. Also, the uneven oxide film 21 is formed with irradiation of a laser beam at 12 J/cm$^2$. Epoxy resin forming the sealing resin body 15 is also used as a material of resin provided onto the terminal 18 and the resin is provided in a shape of a circular truncated cone having a diameter of 3.57 mm at a bottom, a diameter of 2.85 mm at a top, and a height of 3.13 mm. Weld strength, that is, shear strength of the resin with respect to the terminal 18 is evaluated at a shearing speed of 50 μm/sec. A work is kept in a constant-temperature reservoir at 175 degrees and the work is taken out from the constant-temperature reservoir after an elapse of a predetermined time to confirm shear strength at room temperature of 25 degrees. The shear strength set forth in FIG. 14 is an average value when n=5.

As is set forth in FIG. 14, in the case where the terminal 18 is formed of the base member 19 alone, that is, without the metal thin film 20, shear strength decreases with time, which is thought to be attributed to facts that Cu forming the base member 19 is susceptible to oxidation at high temperatures and an oxide film of Cu has low strength.

In the case where the uneven oxide film 21 is absent, a surface of the metal thin film 20 becomes oxidized and forms an oxide film. That is, an oxide film of Ni is formed. However, an oxide film of Ni is stable even at high temperatures and the oxide film grows slower than Cu. Hence, as is set forth in FIG. 14, a decrease in shear strength with time is thought to be less than Cu.

In the case where the uneven oxide film 21 is present, in addition to the effect obtained in the case where the uneven oxide film 21 is absent, a contact area is increased by fine recesses and protrusions on the uneven oxide film 21. Hence, as is set forth in FIG. 14, shear strength is thought to be higher than in the case where the uneven oxide film 21 is absent.

Accordingly, by providing the uneven oxide film 21, a contact area is increased by fine recesses and protrusions and a robust connection structure can be provided between the terminal 18 and the sealing resin body 15. In particular, in the case of the metal thin film 20 chiefly made of Ni, the connection structure can be maintained in a stable manner over a long term.

Second Embodiment

The embodiment above is incorporated in the present embodiment by reference and a description of portions common with the embodiment above is omitted herein.

Figure 15:
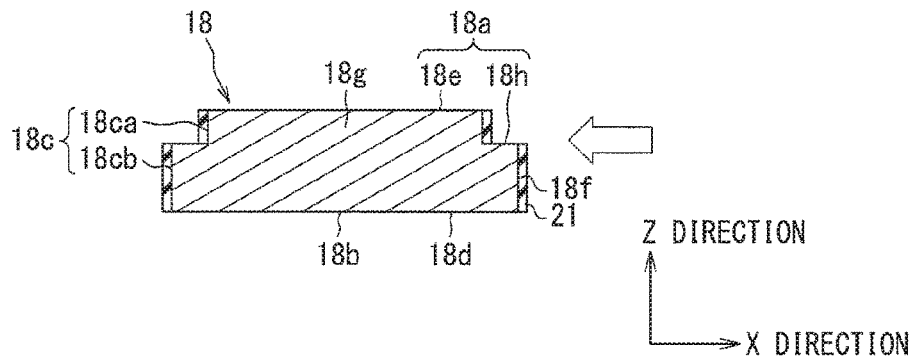
FIG. 15 is a sectional view showing a schematic configuration of a terminal and an uneven oxide film in a semiconductor device according to a second embodiment.

The first embodiment above has described a case where the uneven oxide film 21 is provided to the side surfaces 18$c$ of the terminal 18 of substantially a square column shape. It should be appreciated, however, that a shape of the terminal 18 is not limited to the shape in the described case. In the present embodiment, as is shown in FIG. 15, a terminal 18 has a convex portion 18$g$ and the terminal 18 is of a convex shape protruding toward a first opposing surface 18$a$.

The first opposing surface 18$a$ therefore has a second connection region 18$e$ and an outer peripheral region 18$h$ surrounding the second connection region 18$e$. The outer peripheral region 18$h$ is located at a position more distant from a first heat sink 23 than the second connection region 18$e$. Owing to the presence of the convex portion 18$g$, each side surface 18$c$ is divided to two. More specifically, the side surface 18$c$ has a first divided surface 18$ca$ connecting the second connection region 18$e$ and the outer peripheral region 18$h$ and a second divided surface 18$cb$ connecting the outer peripheral region 18$h$ and a second opposing surface 18$b$. An uneven oxide film 21 is provided to the two divided surfaces 18$ca$ and 18$cb$.

An effect same as the effect obtained in the first embodiment above can be achieved by adopting the configuration as above. As is indicated by a blank arrow of FIG. 15, the uneven oxide film 21 can be formed on the divided surfaces 18$ca$ and 18$cb$ by irradiation of a laser beam from a direction orthogonal to a Z direction.

Figure 16:
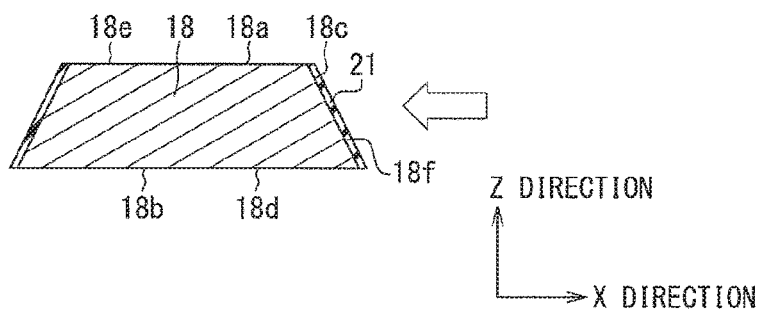
FIG. 16 is a sectional view showing a second modification of the terminal and the uneven oxide film.

According to a second modification shown in FIG. 16, the terminal 18 is formed in a frustum shape. That is, the side surface 18$c$ forms an inclined surface (tapered surface). The uneven oxide film 21 is provided all over the inclined side surface 18$c$. In such a case, too, as is indicated by a blank arrow, the uneven oxide film 21 can be formed on the inclined side surface 18$c$ by irradiation of a laser beam in a direction orthogonal to the Z direction.

Alternatively, the uneven oxide film 21 may be provided to the side surface 18$c$ only in a partial range from an end on a side of a second opposing surface 18$b$ or the uneven oxide film 21 may be provided to the side surface 18$c$ at a position away from both of the first opposing surface 18$a$ and the second opposing surface 18$b$. Further, the uneven oxide film 21 may be provided to the side surface 18$c$ in multiple stages. For example, the multiple uneven oxide films 21 may be provided parallel to one another in the Z direction.

Third Embodiment

The embodiments above are incorporated in the present embodiment by reference and a description of portions common with the embodiments above is omitted herein.

Figure 17:
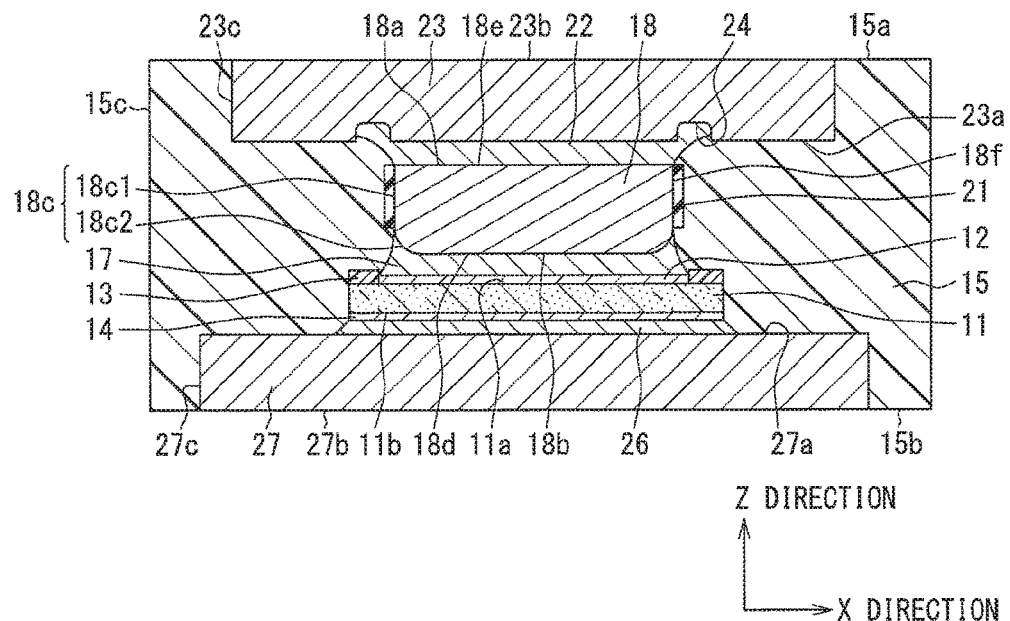
FIG. 17 is a sectional view showing a schematic configuration of a semiconductor device according to a third embodiment.

As is shown in FIG. 17, a terminal 18 has side surfaces 18$c$, each of which includes a first side surface portion 18$c$1 which is a portion of a predetermined range from an end on a side of a first opposing surface 18$a$ and a second side surface portion 18$c$2 which is a portion between the first side surface portion 18$c$1 and a second opposing surface 18$b$. In FIG. 17, the second side surface portion 18$c$2 is of a curved shape (so-called a round shape) protruding outward. When viewed in a Z direction, the second surface portion 18$c$2 also opposes a semiconductor chip 11.

An uneven oxide film 21 is provided to only the first side surface portion 18$c$1 of the side surface 18$c$ and is not provided to the second side surface portion 18$c$2. As is shown in FIG. 17, first solder 17 provided to a surface of the terminal 18 is connected to the second opposing surface 18$b$ and the second side surface portion 18$c$2. That is, the second opposing surface 18$b$ and the second side surface portion 18$c$2 together form a first connection region 18$d$. The first side surface portion 18$c$1 forms a connection region 18$f$.

A base member 19 of the terminal 18 having the second side surface portion 18$c$2 as above is formed by pressing a metal block. The second side surface portion 18$c$2 of a round shape is formed by punching out the base member 19 from a metal block by pressing. In the present embodiment, the second side surface portion 18$c$2 is disposed on a side of the semiconductor chip 11 in the Z direction. In addition, as has been described, the uneven oxide film 21 is not provided to the second side surface portion 18$c$2 and the uneven oxide film 21 is provided to the first side surface portion 18$c$1 alone.

Accordingly, the first solder 17 wets and spreads also along the second side surface portion 18$c$2 during reflow soldering and a satisfactory fillet can be formed. Consequently, a heat dissipation path to transmit heat generated in the semiconductor chip 11 to the terminal 18 can be wider than in a configuration in which the uneven oxide film 21 is provided to the second side surface portion 18$c$2.

The above has described a case where the second side surface portion 18$c$2 is a part of the side surface 18$c$. However, the second surface portion 18$c$2 may be deemed as a part of the second opposing surface 18$b$. In such a case, the second opposing surface 18$b$ has a center portion and a round portion surrounding the center portion, protruding outward and connecting the center portion and the side surface 18$c$.

Fourth Embodiment

The embodiments above are incorporated in the present embodiment by reference and a description of portions common with the embodiments above is omitted herein.

The first embodiment above has described a case where the uneven oxide film 21 is provided to the side surfaces 18c of the terminal 18. In other words, the first embodiment above has described a case where the uneven oxide film 21 is formed by irradiation of a laser beam in a direction orthogonal to a Z direction. In contrast, the present embodiment is characterized in that an uneven oxide film 21 is provided to a surface of a terminal 18 in at least one of a first opposing surface 18a and a second opposing surface 18b.

Figure 18:
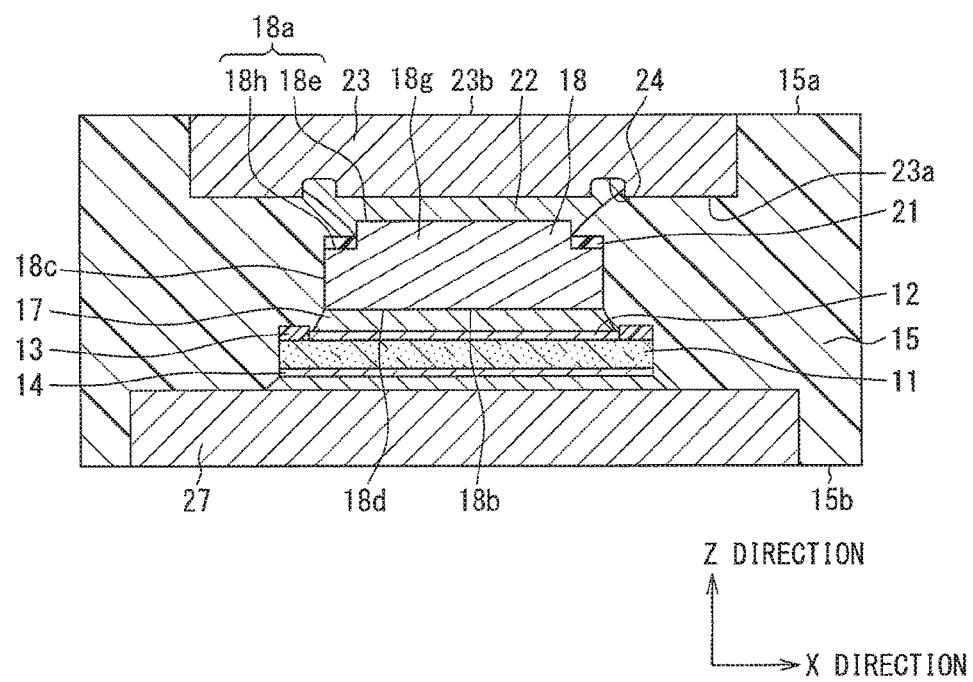
FIG. 18 is a sectional view showing a schematic configuration of a semiconductor device according to a fourth embodiment.

In a case shown in FIG. 18, the terminal 18 has a convex portion 18g as in the second embodiment (see FIG. 15) described above. The first opposing surface 18a has a second connection region 18e and an outer peripheral region 18h. The outer peripheral region 18h opposes a first heat sink 23 in a Z direction over a longer distance than the second connection region 18e. The uneven oxide film 21 is provided to the outer peripheral region 18h.

When an opposing region of the terminal 18 and the first heat sink 23 is narrow, second solder 22 wets and spreads also by a capillary phenomenon. In a case where the uneven oxide film 21 is provided to the outer peripheral region 18h when the first opposing surface 18a is flat, an effect exerted by the uneven oxide film 21 is cancelled out and weakened by a capillary phenomenon. In contrast, according to the present embodiment, the convex portion 18g is provided to the terminal 18 and the second connection region 18e is set as a tip end surface of the convex portion 18g while the outer peripheral region 18h is set as a stepped surface with respect to the second connection region 18e. Hence, an opposing distance between the terminal 18 and the first heat sink 23 becomes longer to the outer peripheral region 18h than to the second connection region 18e. Importantly, the uneven oxide film 21 is provided to the outer peripheral region 18h with a longer opposing distance. Hence, an effect of wetting and spreading by a capillary phenomenon can be reduced or eliminated. That is to say, even when the uneven oxide film 21 is provided to the opposing surface 18a, either the first solder 17 or the second solder 22 can be effectively restricted from wetting and spreading along the surface of the terminal 18 and flowing into the other.

When the terminal 18 of a convex shape is adopted, in particular, the terminal 18 can be readily formed by pressing. Hence, manufacturing processes can be simpler, which can in turn save manufacturing costs.

Figure 19:
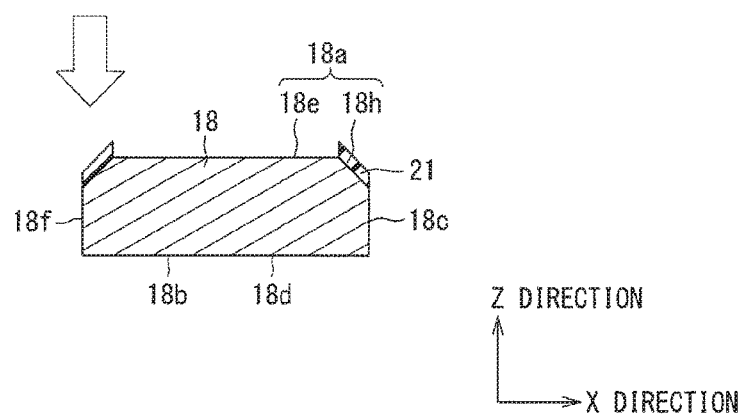
FIG. 19 is a sectional view showing a third modification of the terminal and the uneven oxide film.

The present embodiment has described a case where the uneven oxide film 21 is provided to the outer peripheral region 18h of the terminal 18 of a convex shape. It should be appreciated, however, that a shape of the terminal 18 is not limited to the shape in the described case. According to a third modification shown in FIG. 19, the terminal 18 has a tapered outer peripheral region 18h (inclined surface) as the first opposing surface 18a and the uneven oxide film 21 is provided to the outer peripheral region 18h. Even when configured in the manner as above, an effect same as the effect obtained in the case where the uneven oxide film 21 is provided to the outer peripheral region 18h of the terminal 18 of a convex shape can be achieved, too.

Figure 20:
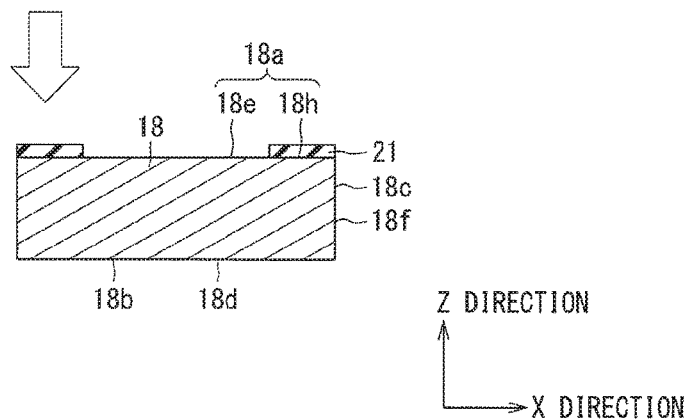
FIG. 20 is a sectional view showing a fourth modification of the terminal and the uneven oxide film.

According to a fourth modification shown in FIG. 20, the terminal 18 is of substantially a square column shape as in the first embodiment above and the uneven oxide film 21 is provided to the outer peripheral region 18h of the flat first opposing surface 18a. In either case shown in FIG. 19 or FIG. 20, the uneven oxide film 21 can be formed by irradiation of a laser beam in the Z direction as is indicated by a blank arrow.

The above has described a case where the uneven oxide film 21 is provided to the first opposing surface 18a. Alternatively, the uneven oxide film 21 may be provided to the second opposing surface 18b in an outer peripheral region surrounding a first connection region 18d. A same effect can be achieved even when configured in such a manner. Further, the uneven oxide film 21 may be provided to both of the first opposing surface 18a and the second opposing surface 18b.

Furthermore, it may be configured in such a manner that the uneven oxide film 21 is additionally provided to side surfaces 18c while the uneven oxide film 21 is provided to at least one of the first opposing surface 18a and the second opposing surface 18b.

Fifth Embodiment

The embodiments above are incorporated in the present embodiment by reference and a description of portions common with the embodiments above is omitted herein.

Figure 21:
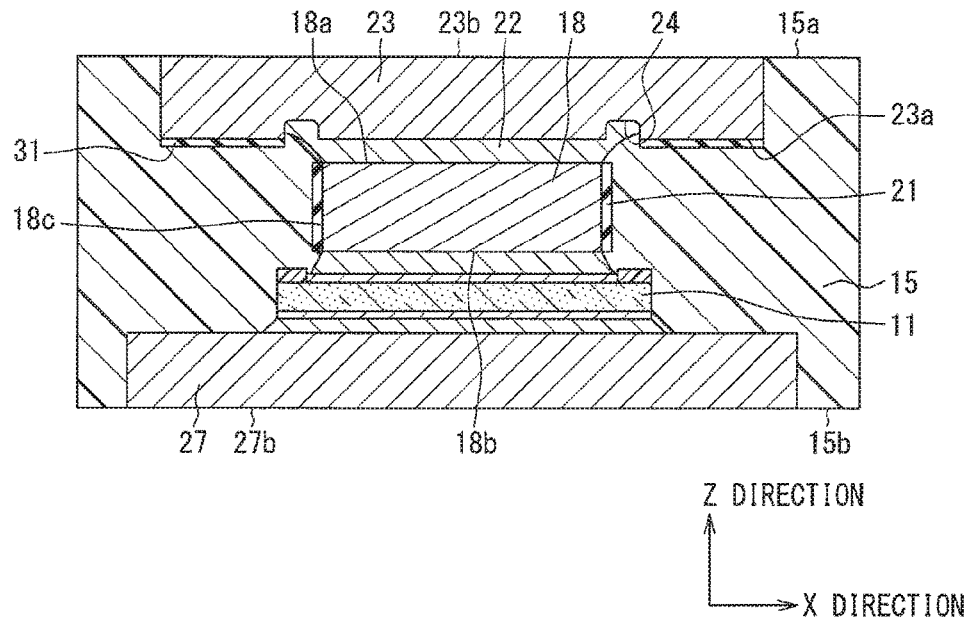
FIG. 21 is a sectional view showing a schematic configuration of a semiconductor device according to a fifth embodiment.

As is shown in FIG. 21, the present embodiment is characterized by including an uneven oxide film 31 provided to a first heat sink 23 in addition to an uneven oxide film 21 provided to a terminal 18.

The uneven oxide film 31 is formed under a same condition as the uneven oxide film 21. Although it is not shown in the drawing, as with the terminal 18, the first heat sink 23 has a base member made of, for example, Cu and a metal thin film chiefly made of, for example, Ni and provided to a surface of the base member. The uneven oxide film 31 is formed by applying a laser beam to a surface of the metal thin film.

The uneven oxide film 31 is provided to a opposing surface 23a of the first heat sink 23 on a periphery of a region to which second solder 22 is connected. In the present embodiment, a groove 24 is provided to the opposing surface 23a and the groove 24 of a ring shape and a portion on an inner side of the groove 24 form a connection region to the second solder 22. Hence, the uneven oxide film 31 is provided all over a portion on an outer side of the groove 24. That is, the uneven oxide film 31 is provided next to the groove 24. The second solder 22 can be thus withheld in the connection region of the second solder 22 by the uneven oxide film 31. For example, even when an amount of the second solder 22 is large, overflow of the second solder 22 to an outer side of the groove 24 can be restricted.

The uneven oxide film 31 may not necessarily be provided all over the surface of a portion on the outer side of the groove 24. Overflow of the second solder 22 to an outer side of the groove 24 can be restricted by providing the uneven oxide film 31 next to the groove 24 so as to surround the second solder 22 instead. The uneven oxide film 31 may also be applicable to the first heat sink 23 without the groove 24. In such a case, too, by providing the uneven oxide film 31 so as to surround the second solder 22, the second solder 22 can be withheld in a region surrounded by the uneven oxide film 31.

A contact area to an sealing resin body 15 is increased by providing the uneven oxide film 31. In addition, an anchoring effect is exerted by the sealing resin body 15 that clings to protrusion portions on the uneven oxide film 31. Hence, adhesion between the first heat sink 23 and the sealing resin body 15 can be enhanced, which can in turn restrict separation of the sealing resin body 15.

The uneven oxide film 21 used herein is the uneven oxide film 21 described in the first embodiment above (see FIG. 2). It should be appreciated, however, that the uneven oxide film 21 is not limited to the uneven oxide film in the described case. The present embodiment can be combined with other embodiments and the respective modifications described above.

Sixth Embodiment

The embodiments above are incorporated in the present embodiment by reference and a description of portions common with the embodiments above is omitted herein.

Figure 22:
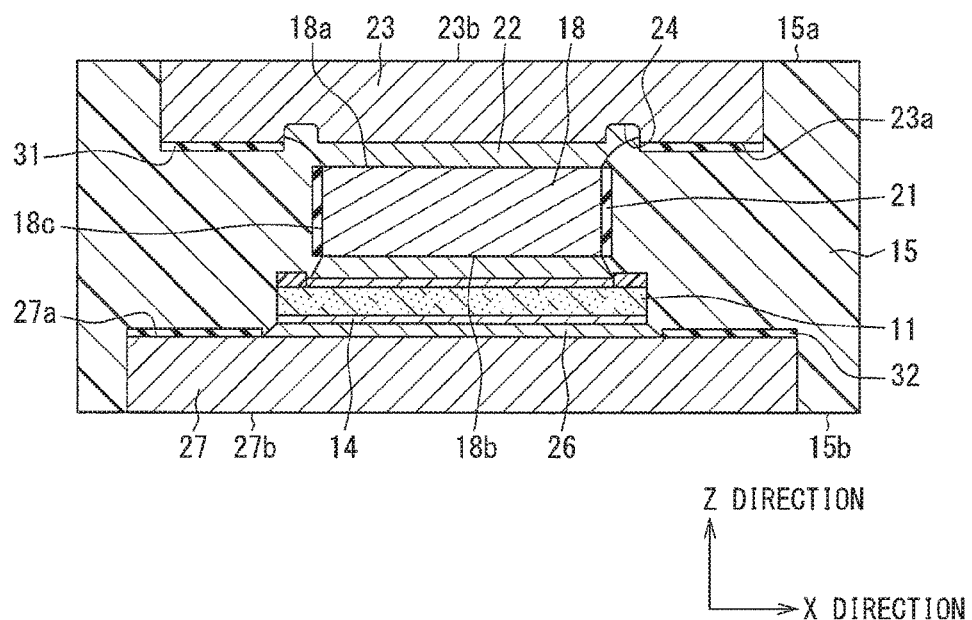
FIG. 22 is a sectional view showing a schematic configuration of a semiconductor device according to a sixth embodiment.

As is shown in FIG. 22, the present embodiment is characterized by including an uneven oxide film 32 provided to a second heat sink 27 in addition to an uneven oxide film 21 provided to a terminal 18. FIG. 22 shows a configuration in which the uneven oxide film 32 is added to the configuration of the fifth embodiment above (see FIG. 21). A semiconductor device 10 therefore includes uneven oxide films 21, 31, and 32.

The uneven oxide film 32 is also formed under a same condition as the uneven oxide film 21. Although it is not shown in the drawing, as with a terminal 18, the second heat sink 27 has a base member made of, for example, Cu, and a metal thin film chiefly made of, for example, Ni and provided to a surface of the base member. The uneven oxide film 32 is formed by applying a laser beam to a surface of the metal thin film.

The uneven oxide film 32 is disposed to a opposing surface 27a of the second heat sink 27 on a periphery of a region to which third solder 26 is connected. More specifically, the uneven oxide film 32 is provided to the opposing surface 27a all over a region on an outer side of a region to which the third solder 26 is connected so as to surround the connection region of the third solder 26. Hence, the third solder 26 can be withheld in the connection region of the third solder 26 by the uneven oxide film 32.

A groove to absorb an excess of the solder may also be provided to the second heat sink 27. In such a case, outflow of the third solder 26 from the groove can be restricted by providing the uneven oxide film 32 next to the groove.

In addition, a contact area to an sealing resin body 15 is increased by providing the uneven oxide film 32. Also, an anchoring effect is exerted by the sealing resin body 15 that clings to protrusion portions on the uneven oxide film 32. Hence, adhesion between the second heat sink 27 and the sealing resin body 15 can be enhanced, which can in turn restrict separation of the sealing resin body 15.

The uneven oxide film 21 used herein is the uneven oxide film 21 described in the first embodiment above (see FIG. 2). It should be appreciated, however, that the uneven oxide film 21 is not limited to the uneven oxide film in the described case. The present embodiment can be combined with the second embodiment above and the respective modifications described above.

Seventh Embodiment

The embodiments above are incorporated in the present embodiment by reference and a description of portions common with the embodiments above is omitted herein. A semiconductor device 10 of the present embodiment will be described according to FIG. 23 through FIG. 27. For ease of illustration, an uneven oxide film 32 is omitted in FIG. 23 and FIG. 24. Also, for ease of illustration, a protection film 13 is omitted in FIG. 27. For the purpose of clarification, regions within which uneven oxide films 31 and 32 are formed are shaded in FIG. 25 and FIG. 26.

Figure 24:
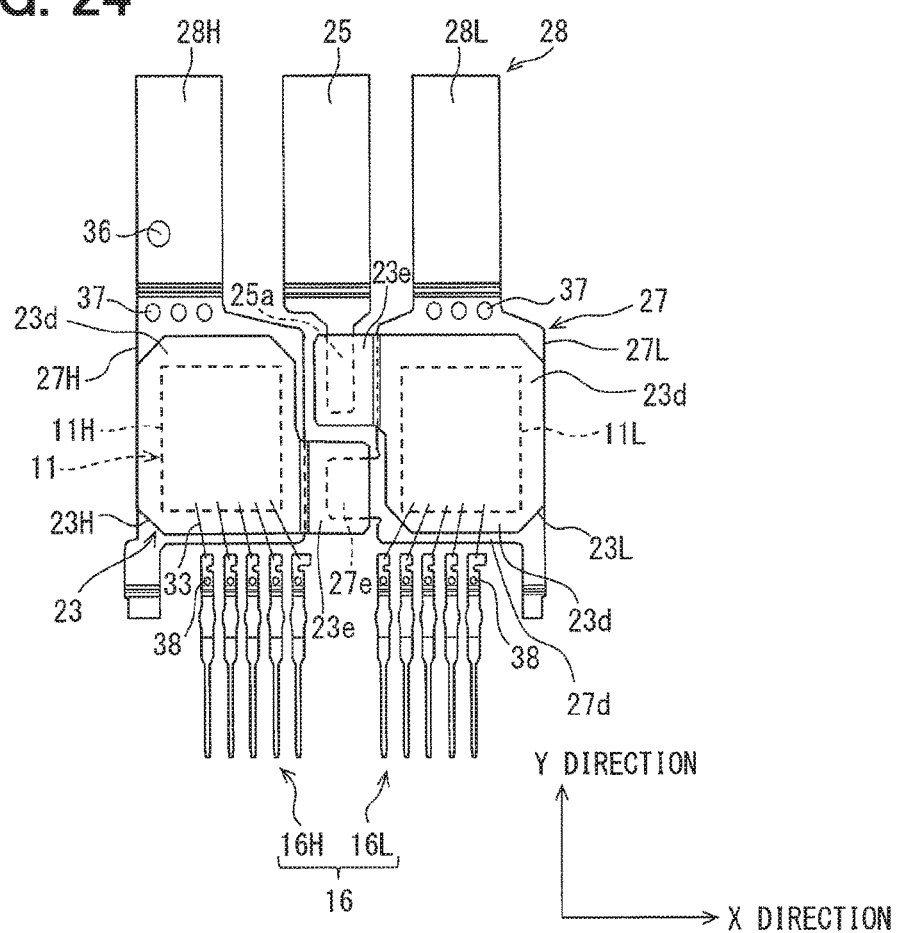
FIG. 24 is a top view showing a semiconductor device when an sealing resin body is omitted.
Figure 27:
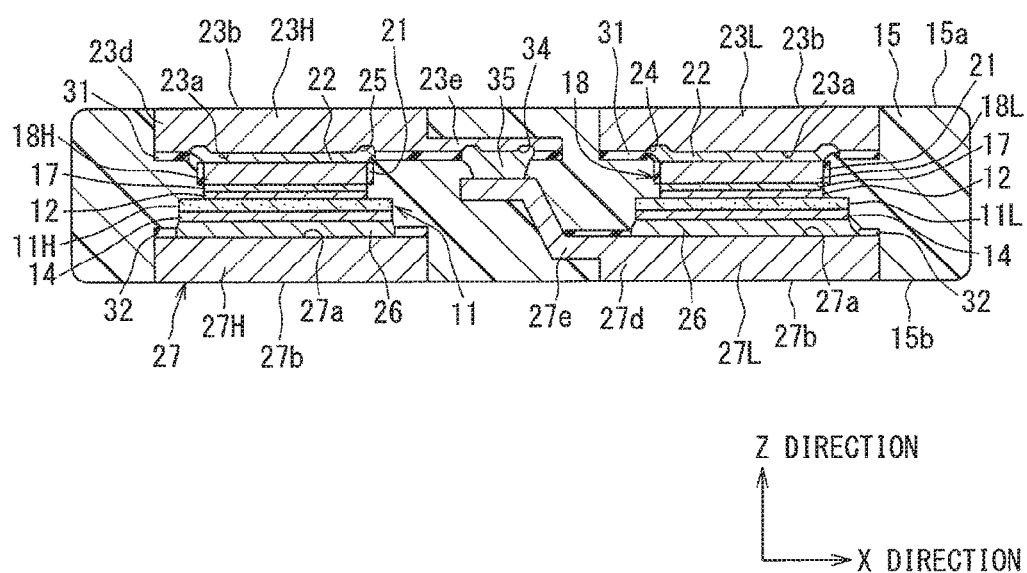
FIG. 27 is a sectional view taken along the line XXVII-XXVII of FIG. 23.

As are shown in FIG. 24 and FIG. 27, the semiconductor device 10 includes two semiconductor chips 11 forming upper and lower arms for one phase of a three-phase inverter as the semiconductor chip 11. Likewise, the semiconductor device 10 includes two sets of signal terminals 16 and two terminals 18. Also, the semiconductor device 10 has two first heat sinks 23 and two second heat sinks 27. Herein, regarding the semiconductor chips 11, the signal terminals 16, the terminals 18, the first heat sinks 23, and the second heat sinks 27, a capital H is appended to reference numerals for components forming the upper arm and a capital L is appended to reference numerals for components forming the lower arm. Regarding other components, such as emitter electrodes 12, collector electrodes 14, and respective solders 17, 22, and 26, components forming the upper arm and components forming the lower arm are labelled with same reference numerals for ease of description.

The semiconductor chips 11H and 11L are of substantially a same planar shape, to be more specific, both are flat in substantially a square shape, and both are of substantially a same size and have substantially a same thickness. The semiconductor chips 11H and 11L are disposed with the collector electrodes 14 located on a same side in a Z direction. The semiconductor chips 11H and 11L are positioned at substantially a same height in the Z direction and located laterally side by side in an X direction.

As is shown in FIG. 24, the upper-arm signal terminals 16H are electrically connected to a pad of the semiconductor chip 11H via wires 33. Also, the lower-arm signal terminals 16L are electrically connected to a pad of the semiconductor chip 11L via the wires 33. Both of the signal terminals 16H and 16L are extended in a Y direction and protrude to an outside of an sealing resin body 15 from a same side surface. The signal terminals 16H and 16L are disposed side by side in the X direction.

The upper-arm first heat sink 23H is disposed on a side of the emitter electrode 12 of the semiconductor chip 11H. The first heat sink 23H is provided so as to enclose the semiconductor chip 11H when viewed in projection in the Z direction. The upper-arm terminal 18H is interposed between a opposing surface 23a of the first heat sink 23H and the emitter electrode 12 on the semiconductor chip 11H. The emitter electrode 12 on the semiconductor chip 11H and the terminal 18H are connected by the first solder 17.

Likewise, the lower-arm first heat sink 23L is disposed on a side of the emitter electrode 12 of the semiconductor chip 11L. The first heat sink 23L is provided so as to enclose the semiconductor chip 11L when viewed in projection in the Z direction. The lower-arm terminal 18L is interposed between the opposing surface 23a of the first heat sink 23L and the emitter electrode 12 on the semiconductor chip 11L. The emitter electrode 12 on the semiconductor chip 11L and the terminal 18L are connected by the first solder 17.

In the present embodiment, the terminals 18H and 18L are of a common shape. As is shown in FIG. 27, an uneven oxide film 21 is provided to side surfaces 18c of the respective terminals 18H and 18L. Also, the first heat sinks 23H and 23L are of a common shape and the first heat sink 23H and the first heat sink 23L are disposed in a double symmetrical configuration.

Figure 23:
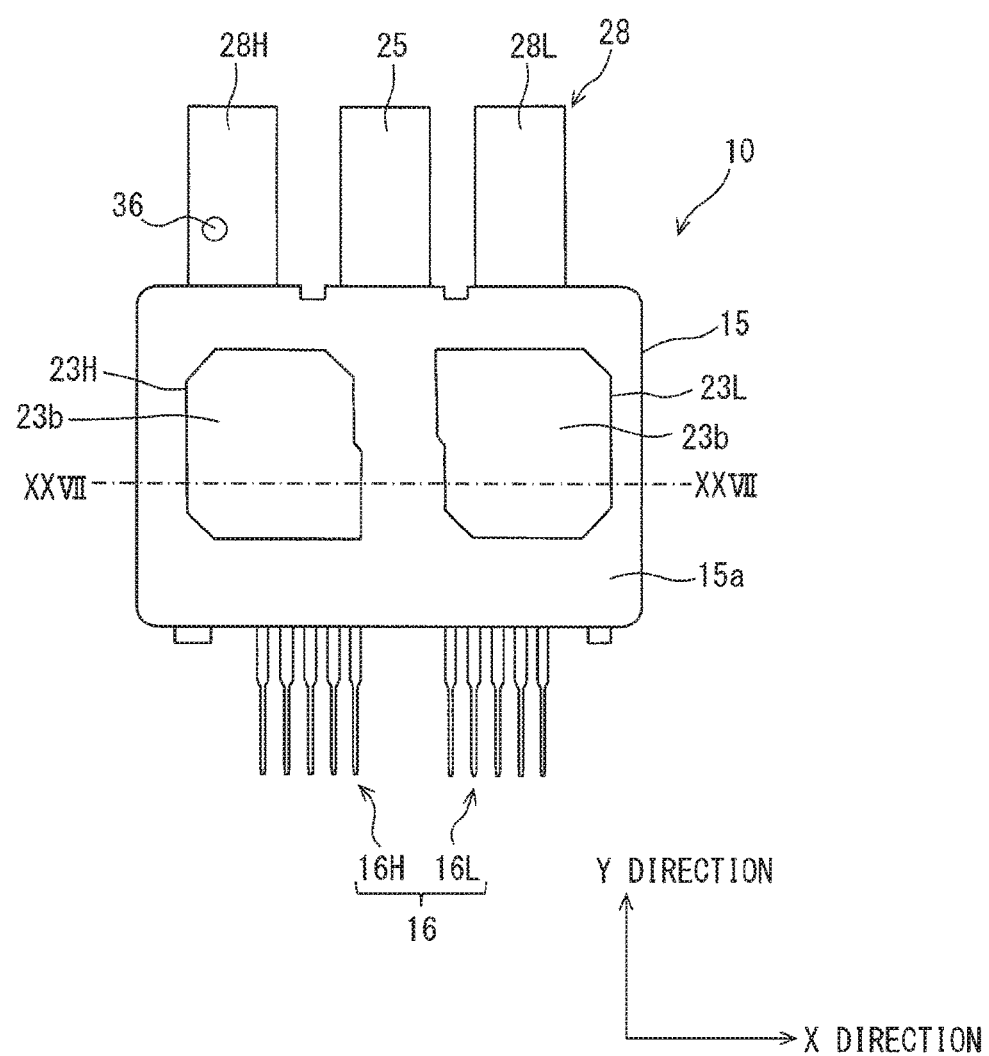
FIG. 23 is a top view showing a schematic configuration of a semiconductor device according to a seventh embodiment.
Figure 25:
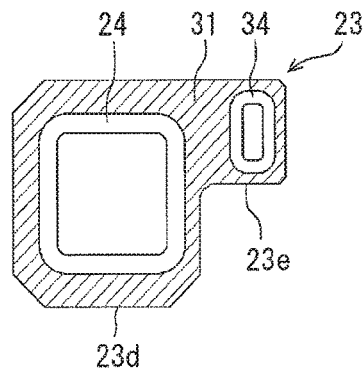
FIG. 25 is a top view showing a range within which an uneven oxide film is provided to a first heat sink.

As are shown in FIGS. 24 and 25, the first heat sink 23 (23H, 23L) is flat and formed in substantially an L shape, and has a main body portion 23d connected to the corresponding terminal 18 via the second solder 22 and a joint portion 23e extended from the main body portion 23d. A groove 24 is provided to the opposing surface 23a in the main body portion 23d of the first heat sink 23. A surface of the main body portion 23d opposite to the terminal 18 forms a heat dissipation surface 23b of the first heat sink 23. As is shown in FIG. 23, the heat dissipation surface 23b of the upper-arm first heat sink 23H and the heat dissipation surface 23b of the lower-arm first heat sink 23L are exposed from one surface 15a of the sealing resin body 15. The heat dissipation surfaces 23b of the respective first heat sinks 23H and 23L are aligned side by side to each other in the X direction.

The joint portion 23e is made thinner than the main body portion 23d so as to be covered with the sealing resin body 15. In the present embodiment, the main body portion 23d and the joint portion 23e are flush with each other on a side of the opposing surface 23a. A groove 34 is provided to the opposing surface 23a in the joint portion 23e of the first heat sink 23. As are shown in FIG. 25 and FIG. 27, the groove 34 is provided so as to surround a connection portion of the joint portion 23e and a connection target of the joint portion 23e. As is shown in FIG. 27, the joint portion 23e and a connection target of the joint portion 23e, for example, a joint portion 27e described below are connected by solder 35. The solder 35 is subject to reflow soldering at same timing with the second solder 22. The groove 34 is provided to absorb (store) an excess of the solder 35 flowing out from an opposing region of the joint portion 23e and a connection target of the joint portion 23e. The solder 35 is disposed in the groove 34 and a region surrounded by the groove 34 when viewed in projection in the Z direction.

The uneven oxide film 31 is provided to the opposing surface 23a of the first heat sink 23. As is indicated by shading in FIG. 25, the uneven oxide film 31 is provided to the opposing surface 23a other than inside the groove 24 and a region surrounded by the groove 24 and inside the groove 34 and a region surrounded by the groove 34. Hence, the second solder 22 flowing out of the groove 24 can be restricted by the uneven oxide film 31. Also, the solder 35 flowing out of the groove 34 can be restricted by the uneven oxide film 31. In addition, adhesion between the opposing surface 23a and the sealing resin body 15 can be enhanced.

As are shown in FIG. 24 and FIG. 27, the joint portion 23e of the first heat sink 23H is connected to the joint portion 27e of the lower-arm second heat sink 27L via the solder 35. Meanwhile, as is shown in FIG. 24, the joint portion 23e of the first heat sink 23L is connected to an extended portion 25a of a main terminal 25 via the solder 35.

The main terminal 25 is a separate member from the first heat sink 23. The main terminal 25 is connected to a low potential side of a DC power supply and is therefore referred to also as a low-potential power-supply terminal or an N terminal. As is shown in FIG. 25, the main terminal 25 is extended in a Y direction and, as is shown in FIG. 23, protrudes to an outside of the sealing resin body 15 from a side surface opposite to the side surface from which the signal terminals 16 are extended. A length in the X direction, that is, a width of the extended portion 25a is narrower than a width of other portions of the main terminal 25. The extended portion 25a is disposed between the main body portions 23d of the respective first heat sinks 23H and 23L when viewed in projection in the Z direction.

The upper-arm second heat sink 27H is disposed on a side of the collector electrode 14 of the semiconductor chip 11H. The second heat sink 27H is provided so as to enclose the semiconductor chip 11H when viewed in projection in the Z direction. The third solder 26 is interposed between an opposing surface 27a of the second heat sink 27H and the collector electrode 14 on the semiconductor chip 11H. The second heat sink 27H and the collector electrode 14 on the semiconductor chip 11H are connected by the third solder 26. A heat dissipation surface 27b of the second heat sink 27H is exposed from a rear surface 15b of the sealing resin body 15.

Figure 26:
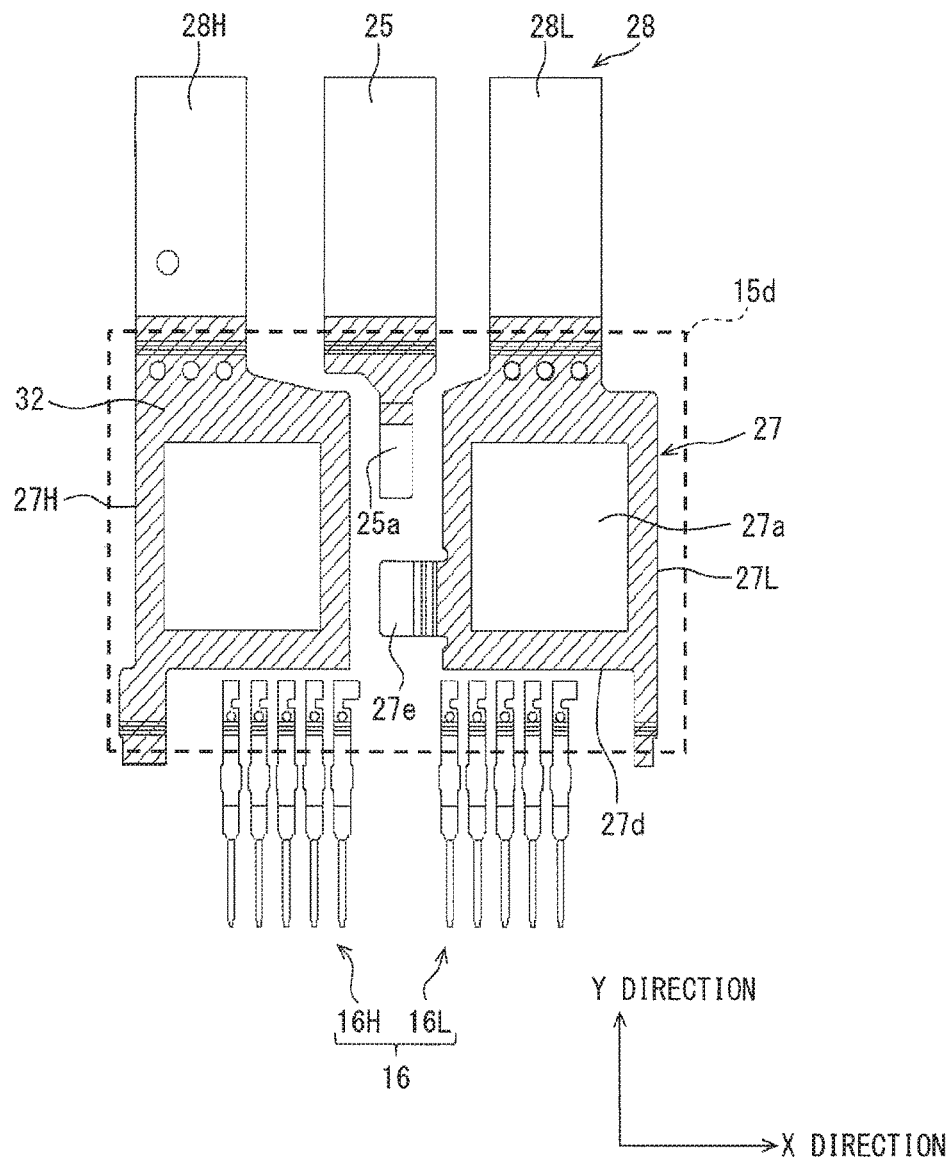
FIG. 26 is a top view showing a range within which an uneven oxide film is provided to a second heat sink and main terminals.

As are shown in FIG. 24 and FIG. 26, a main terminal 28H is coupled to the second heat sink 27H. The main terminal 28H is connected to a high potential side of a DC power supply and is therefore referred to also as a high-potential power-supply terminal or a P terminal. The main terminal 28H may be formed integrally with the second heat sink 27H or provided as a separate member and connected to the second heat sink 27H. In the present embodiment, the main terminal 28H is formed integrally with the second heat sink 27H. The main terminal 28H is thinner than the second heat sink 27H. the main terminal 28H is extended from one of side surfaces of the second heat sink 27H in the Y direction and, as is shown in FIG. 23, protrudes to an outside of the sealing resin body 15 from a side surface from which the main terminal 25 (N terminal) also protrudes.

The lower-arm second heat sink 27L is provided side by side with the second heat sink 27H in the X direction. The second heat sink 27L is disposed on a side of the collector electrode 14 of the semiconductor chip 11L and provided so as to enclose the semiconductor chip 11L when viewed in projection in the Z direction. The third solder 26 is also interposed between the opposing surface 27a of the second heat sink 27L and the collector electrode 14 on the semiconductor chip 11L. The second heat sink 27L and the collector electrode 14 on the semiconductor chip 11L are connected by the third solder 26. The heat dissipation surface 27b of the second heat sink 27L is also exposed from the rear surface 15b of the sealing resin body 15. The heat dissipation surfaces 27b of the respective second heat sinks 27H and 27L are also aligned side by side to each other in the X direction.

As are shown in FIG. 24 and FIG. 26, a main terminal 28L is coupled to the second heat sink 27L. The main terminal 28L is connected to an output line of a three-phase motor and is therefore referred to also as an output terminal or an O terminal. The main terminal 28L may be formed integrally with the second heat sink 27L or provided as a separate member and connected to the second heat sink 27L. In the present embodiment, the main terminal 28L is formed integrally with the second heat sink 27L. The main terminal 28L is thinner than the second heat sink 27L. The main terminal 28L is extended from one of side surfaces of the second heat sink 27L in the Y direction and, as is shown in FIG. 23, protrudes to an outside of the sealing resin body 15 from a side surface from which the main terminal 25 (N terminal) also protrudes.

Protruding portions of the main terminals 25, 28H, and 28L from the sealing resin body 15 are located at substantially a same position in the Z direction. The main terminal 28H (P terminal), the main terminal 25 (N terminal), and the main terminal 28L (O terminal) are sequentially aligned in the X direction.

As are shown in FIG. 24, FIG. 26, and FIG. 27, the lower-arm second heat sink 27L as one of the second heat sinks 27 has a main body portion 27d connected to the collector electrode 14 on the semiconductor chip 11L via the third solder 26 and the joint portion 27e extended from the main body portion 27d. The joint portion 27e is made thinner than the main body portion 27d. The joint portion 27e is extended from a side surface of the main body portion 27d opposing the second heat sink 27H in the X direction so as to overlap the joint portion 23e of the first heat sink 23H when viewed in projection in the Z direction. The joint portion 27e is connected to the joint portion 23e via the solder 35 and is therefore extended toward the first heat sink 23H while being bent twice.

The uneven oxide film 32 is provided to the opposing surface 27a of the second heat sink 27. As is indicated by shading in FIG. 26, the uneven oxide 32 is provided to the opposing surface 27a so as to surround a connection region of the third solder 26. The uneven oxide film 32 is provided to the opposing surface 27a other than the connection region of the third solder 26. The uneven oxide film 32 is provided to the joint portion 27e up to a first bent portion, that is, to a portion substantially flush with the opposing surface 27a in the main body portion 27d. The uneven oxide film 32 is also provided to a part of the main terminals 28H and 28L continuing to the corresponding main body portions 27d. An alternate long and short dash line of FIG. 26 indicates a position of an end 15d of the sealing resin body 15. The uneven oxide film 32 is provided seamlessly from the second heat sink 27 to the main terminal 28 (28H, 28L) over the end 15d by a predetermined distance. A portion of the main terminal 28 where the uneven oxide film 32 is absent is a connection portion to an unillustrated bus bar.

In the present embodiment, the uneven oxide film 32 is also provided to the main terminal 25. The uneven oxide film 32 is also provided over the end 15d of the sealing resin body 15 to the main terminal 25 by a predetermined distance. The uneven oxide film 32 is provided to the main terminal 25 other than a connection portion of the solder 35 in the extended portion 25a and a connection portion to the unillustrated bus bar.

The semiconductor device 10 configured as above is so-called a 2-in-1 package including the two semiconductor chips 11H and 11L. Heat in the semiconductor chips 11H and 11L can be dissipated to both of the one surface 15a and the rear surface 15b of the sealing resin body 15. The respective oxide films 21, 31, and 32 are formed by irradiation of a laser beam in the same manner as described above.

Numeral 36 denotes a through-hole provided to the main terminal 28H to locate a lead frame including the main terminal 28H to a proper position. The through-hole 36 is provided to a region where the uneven oxide film 32 is absent. Numeral 37 denotes through-holes provided to a periphery of a coupling portion of the second heat sink 27 and the main terminal 28 to restrict separation of the sealing resin body 15. Numeral 38 denotes through-holes provided to the signal terminals 16 to restrict separation of the sealing resin body 15. The through-holes 37 and 38 are filled with the sealing resin body 15.

The embodiments above have described a case where the semiconductor device 10 is a 1-in-1 package having one semiconductor chip 11 and a case where the semiconductor device 10 is 2-in-1 package having the two semiconductor chips 11. It should be appreciated, however, that the number of the semiconductor chips 11 is not limited to one or two as in the cases described above. For example, the present disclosure is also applicable to a configuration having six semiconductor chips 11 forming upper and lower arms in three phases.

The above has described a case where the IGBT and the FWD are provided to a same chip. However, the present disclosure is also applicable to a configuration in which the IGBT and the FWD are provided to different chips.

The above has described a case where the semiconductor device 10 includes the sealing resin body 15. However, the present disclosure is also applicable to a configuration in which the sealing resin body 15 is omitted.

The above has described a case where the semiconductor device 10 includes the third solder 26, the second heat sink 27, and the main terminal 28. However, the present disclosure is also applicable to a configuration in which the third solder 26, the second heat sink 27, and the main terminal 28 are omitted.

The above has described a case where surfaces (heat-dissipation surfaces 23b and 27b) of the respective heat sinks 23 and 27 opposite to the semiconductor chip 11 are exposed from the sealing resin body 15. However, the present disclosure is also applicable to a configuration in which the surfaces opposite to the semiconductor chip 11 are not exposed from the sealing resin body 15.

Metal forming a metal thin film 20 is not limited to Ni. The uneven oxide films 21, 31, and 32 are not limited to an oxide of Ni, either. The uneven oxide films 21, 31, and 32 only have to be formed of an oxide of metal same as the metal forming the metal thin film 20.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
a semiconductor chip having an electrode on one surface;
a first conductive member disposed on one surface side of the semiconductor chip;
a metal member having a base member made of a metal material and a membrane arranged on a surface of the base member, and disposed between the semiconductor chip and the first conductive member;
a first solder disposed between the electrode of the semiconductor chip and the metal member, and connecting the electrode and the metal member; and
a second solder disposed between the metal member and the first conductive member, and connecting the metal member and the first conductive member, wherein:
the membrane has a metal thin film arranged on the surface of the base member and an uneven oxide film having a recess and a protrusion continuously disposed on a surface and, the uneven oxide film being made of an oxide of a metal that is the same as a metal which is a main component of the metal thin film;
the uneven oxide film is arranged on the metal thin film in at least a part of a connection region of a surface of the metal member so as to restrict one of the first solder and the second solder from flowing into the other of the first solder and the second solder, the connection region connecting a first connection region to which the first solder is connected and a second connection region to which the second solder is connected; and
the recess and the protrusion of the uneven oxide film are continuously and alternately disposed on the connection region along a connecting direction from the first connection region to the second connection region.

2. The semiconductor device according to claim 1, wherein:
the uneven oxide film is a laser beam irradiation film.

3. The semiconductor device according to claim 1, wherein:
the metal thin film includes Ni as a main component.

4. The semiconductor device according to claim 3, wherein:
the metal thin film is a plating film.

5. The semiconductor device according to claim 4, wherein:
the metal thin film is an electroless plating film.

6. The semiconductor device according to claim 1, wherein:
the surface of the metal member includes a first opposing surface which is opposed to the first conductive member and has the second connection region and an outer peripheral region surrounding the second connection region;
an opposing distance between the outer peripheral region and the first conductive member is longer than an opposing distance between the second connection region and the first conductive member in a direction perpendicular to the one surface; and
the uneven oxide film is disposed in the outer peripheral region.

7. The semiconductor device according to claim 6, wherein:
the metal member has a convex shape in which the second connection region protrudes with respect to the outer peripheral region.

8. The semiconductor device according to claim 1, wherein:
the metal member has a first opposing surface including the second connection region and opposing the first conductive member, a second opposing surface including the first connection region and opposing the semiconductor chip, and a side surface connecting the first opposing surface and the second opposing surface; and
the uneven oxide film is disposed on the side surface.

9. The semiconductor device according to claim 8, wherein:
the uneven oxide film is disposed on the side surface in a predetermined range from an end on a side of the first opposing surface.

10. The semiconductor device according to claim 9, wherein:
the side surface has a first side surface portion which is a portion in the predetermined range from the end on the side of the first opposing surface, and a second side surface portion which is a portion between the first side surface portion and the second opposing surface and has a curved shape that protrudes outward;
the second side surface portion and the second opposing surface provides the first connection region; and
the uneven oxide film is disposed only on the first side surface portion of the side surface.

11. The semiconductor device according to claim 8, wherein:
the uneven oxide film is arranged along an entire circumference of the side surface.

12. The semiconductor device according to claim 1, wherein:
the uneven oxide film is disposed on an opposing surface of the first conductive member opposing the metal member so as to surround the second solder.

13. The semiconductor device according to claim 12, wherein:
the first conductive member has a groove to absorb an excess of the second solder in the opposing surface opposing the metal member; and
the uneven oxide film is disposed adjacent to the groove.

14. The semiconductor device according to claim 1, wherein:
the semiconductor chip has an other electrode on a rear surface opposite to the one surface; and
the semiconductor device further includes a second conductive member disposed on a rear surface side of the semiconductor chip, and a third solder disposed between the other electrode on the rear surface side of the semiconductor chip and the second conductive member, the third solder connecting the other electrode on the rear surface side and the second conductive member.

15. The semiconductor device according to claim 14, wherein:
the uneven oxide film is disposed on an opposing surface of the second conductive member opposing the semiconductor chip so as to surround the third solder.

16. The semiconductor device according to claim 1, further comprising:
a sealing resin body that integrally seals the semiconductor chip, at least a part of the first conductive member, the metal member, the first solder and the second solder, wherein:
the sealing resin body contacts the uneven oxide film.

17. The semiconductor device according to claim 1, wherein:
the recess and the protrusion of the uneven oxide film provide a rough surface to which the first solder and the second solder hardly fit.

18. The semiconductor device according to claim 1, wherein:
the metal thin film has a recess and a protrusion; and
the recess and the protrusion of the uneven oxide film are arranged at pitches finer than a width of the recess of the metal thin film.

* * * * *